US012598859B2

(12) United States Patent
Choi et al.

(10) Patent No.: US 12,598,859 B2
(45) Date of Patent: Apr. 7, 2026

(54) LIGHT EMITTING DEVICE AND LIGHT EMITTING DISPLAY DEVICE INCLUDING THE SAME

(71) Applicant: LG Display Co., Ltd., Seoul (KR)

(72) Inventors: Hong Seok Choi, Paju-si (KR); Hyun Jin Cho, Paju-si (KR); Sun Hee Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 832 days.

(21) Appl. No.: 17/976,180

(22) Filed: Oct. 28, 2022

(65) Prior Publication Data

US 2023/0217672 A1 Jul. 6, 2023

(30) Foreign Application Priority Data

Dec. 31, 2021 (KR) ........................ 10-2021-0194662

(51) Int. Cl.
*H10K 50/13* (2023.01)
*H10K 101/00* (2023.01)

(52) U.S. Cl.
CPC ....... *H10K 50/131* (2023.02); *H10K 2101/27* (2023.02)

(58) Field of Classification Search
CPC .... H10K 50/125; H10K 50/13; H10K 50/131; H10K 2101/27; H10K 2101/40
See application file for complete search history.

(56) References Cited

U.S. PATENT DOCUMENTS

2006/0232194 A1* 10/2006 Tung .................... H10K 50/131 313/506
2008/0284318 A1* 11/2008 Deaton .................. H10K 50/11 313/504
2020/0052226 A1* 2/2020 Seo ........................ H10K 85/40
(Continued)

FOREIGN PATENT DOCUMENTS

JP 2020-025099 A 2/2020
KR 10-2021-0137104 A 11/2021

OTHER PUBLICATIONS

Himmetoglu et al., J. Chem. Phys. 137, 154309 (2012).*
(Continued)

*Primary Examiner* — Vu A Nguyen
(74) *Attorney, Agent, or Firm* — Morgan, Lewis & Bockius LLP

(57) ABSTRACT

A light emitting device including a first electrode and a second electrode facing each other, a blue fluorescent light emitting layer and a non-blue phosphorescent light emitting layer in contact with each other between the first electrode and the second electrode, a first common layer between the first electrode and the non-blue phosphorescent light emitting layer, and a second common layer between the blue fluorescent light emitting layer and the second electrode. The non-blue phosphorescent light emitting layer includes a first host, and a first dopant having a first triplet excitation level and a first singlet-triplet excitation level difference. The blue fluorescent light emitting layer includes a second dopant having: a second singlet-triplet excitation level difference that is smaller than the first singlet-triplet excitation level difference, and a second triplet excitation level that is higher than the first triplet excitation level, and a second host.

19 Claims, 17 Drawing Sheets

(56) References Cited

U.S. PATENT DOCUMENTS

| | | | |
|---|---|---|---|
| 2020/0119299 A1 | 4/2020 | Hong et al. | |
| 2021/0167313 A1 | 6/2021 | Seo | |
| 2022/0190246 A1* | 6/2022 | Ishisone ................. | C09K 11/06 |

OTHER PUBLICATIONS

Office Action issued on Jul. 21, 2025 in Korean Patent Application No. 10-2021-0194662.

Combined Search and Examination Report issued in corresponding GB Patent Application No. 2215987.5 dated May 2, 2023.

* cited by examiner

LIGHT EMITTING DEVICE AND LIGHT EMITTING DISPLAY DEVICE INCLUDING THE SAME

CROSS-REFERENCE TO RELATED APPLICATIONS

This application claims the benefit of and priority to Korean Patent Application No. 10-2021-0194662, filed on Dec. 31, 2021, which is hereby incorporated by reference as if fully set forth herein.

BACKGROUND

Technical Field

The present disclosure relates to a light emitting device that may be capable of improving the efficiency of adjacent light emitting layers by reducing or preventing the ratio of excitons quenched in the light emitting layers in a structure in which a blue light emitting layer comes into contact with other color light emitting layers. The present disclosure also relates to a light emitting display device including the light emitting device.

Description of the Related Art

Recently, with the arrival of the information age, display devices for visually rendering signals based on electrical information have been rapidly developed. In response thereto, a variety of display devices having excellent characteristics, such as thinness, low weight, and low power consumption, have been developed and are rapidly replacing existing cathode ray tubes (CRTs).

Thereamong, a light emitting display device that does not require a separate light source and has a light emitting device in a display panel without a separate light source to make the display device compact and realize clear color has been considered a competitive application.

SUMMARY

Accordingly, embodiments of the present disclosure are directed to a light emitting device and a light emitting display device including the same that substantially obviate one or more problems due to the limitations and disadvantages of the related art.

In a display device that performs a display operation using the self-luminescence principle of a light emitting device, the light emitting device provided in each subpixel may include a plurality of light emitting layers emitting light of different colors between two electrodes, thereby emitting white light. The blue light emitting layer may have a limitation of having a lower efficiency compared to the other color light emitting layer(s). The blue light emitting layer may not use energy supplied from the other color light emitting layer(s) for light emission. In a light emitting device including a blue light emitting layer adjacent to other color light emitting layers, luminous efficacy in the blue light emitting layer may not increase. Internal excitons not used for light emission may be quenched.

An object of the present disclosure is to provide a light emitting device and a light emitting display device using the same to solve the above problems. The light emitting device includes a structure in which a plurality of light emitting layers are adjacent to one another. Quenched excitons may be reduced. The efficiency of both the blue light emitting layer and the light emitting layer adjacent thereto may be improved by changing difference in the triplet excitation level between materials of light emitting layers adjacent to a blue light emitting layer. Alternatively, the physical properties of the blue host capable of preventing or reducing Dexter energy transfer to the blue host may be changed.

The features and objects of the present disclosure are not limited to those mentioned above. Additional features and aspects will be set forth in part in the description that follows and in part will become apparent to those skilled in the art from the description or may be learned by practice of the inventive concepts provided herein. Other features and aspects of the inventive concepts may be realized and attained by the structure particularly pointed out in, or derivable from, the written description, the claims hereof, and the appended drawings.

The light emitting device the embodiments of the present disclosure and a light emitting display including the same include a blue fluorescent light emitting layer and a non-blue phosphorescent light emitting layer adjacent thereto in at least one of a plurality of stacks. The physical properties of the light emitting layer are changed, thereby preventing or minimizing or reducing the non-light emission loss of excitons distributed to each light emitting layer. Lifespan may be improved without causing a decrease in the efficiency of both light emitting layers.

To achieve these objects and other advantages and in accordance with the purpose of the disclosure, as embodied and broadly described herein, a light emitting device may include: a first electrode and a second electrode facing each other and spaced apart from each other, a blue fluorescent light emitting layer and a non-blue phosphorescent light emitting layer in contact with each other between the first electrode and the second electrode, a first common layer between the first electrode and the non-blue phosphorescent light emitting layer, and a second common layer between the blue fluorescent light emitting layer and the second electrode. The non-blue phosphorescent light emitting layer may include: a first host, and a first dopant having a first triplet excitation level (T1) and a first singlet-triplet excitation level difference (ΔEst). The blue fluorescent light emitting layer may include: a second dopant having: a second singlet-triplet excitation level difference that is smaller than the first singlet-triplet excitation level difference, a second triplet excitation level that is higher than the first triplet excitation level, and a second singlet excitation level (S1), and a second host to transfer energy to the second singlet excitation level and to suppress Dexter energy transfer from the first dopant.

In another aspect of the present disclosure, a light emitting device may include: a first electrode and a second electrode facing each other and spaced apart from each other, a plurality of stacks between the first electrode and the second electrode, and a charge generation layer between the plurality of stacks. One of the plurality of stacks may include a blue fluorescent light emitting layer and a non-blue phosphorescent light emitting layer in contact with each other. At least one of remaining stacks may include a single light emitting layer. The non-blue phosphorescent light emitting layer may include: a first host, and a first dopant having a first triplet excitation level (T1) and a first singlet-triplet excitation level difference (ΔEst). The blue fluorescent light emitting layer may include: a second dopant having: a second singlet-triplet excitation level difference that is smaller than the first singlet-triplet excitation level difference, and a second triplet excitation level that is higher than the first triplet excitation level; and a second host having a third triplet excitation level between the first triplet excitation level and the second triplet excitation level.

In yet another aspect of the present disclosure, a light emitting device may include: a first electrode and a second electrode facing each other and spaced apart from each other, a plurality of stacks between the first electrode and the second electrode; and a charge generation layer between the plurality of stacks. The plurality of stacks may include a first stack including a blue fluorescent light emitting layer and a non-blue phosphorescent light emitting layer in contact with each other. At least one of remaining stacks may include a single light emitting layer. The non-blue phosphorescent light emitting layer may include a first host, and a first dopant having a first triplet excitation level (T1) and a first singlet-triplet excitation level difference (ΔEst). The blue fluorescent light emitting layer may include: a second dopant having: a second singlet-triplet excitation level difference that is smaller than the first singlet-triplet excitation level difference, and a second triplet excitation level that is higher than the first triplet excitation level, and a second host comprising a core compound and a spacer disposed at a distance of 1 nm or more from an outer surface of the core compound.

In yet another aspect of the present disclosure, a light emitting display device may include a substrate comprising a plurality of subpixels, a driving circuit comprising at least one thin film transistor at each of the plurality of subpixels, and a light emitting device connected to the driving circuit at each of the plurality of subpixels. The light emitting device may include: a first electrode and a second electrode facing each other and spaced apart from each other, a blue fluorescent light emitting layer and a non-blue phosphorescent light emitting layer in contact with each other between the first electrode and the second electrode. The non-blue phosphorescent light emitting layer may include: a first host, and a first dopant having a first triplet excitation level (T1) and a first singlet-triplet excitation level difference (ΔEst). The blue fluorescent light emitting layer may include: a second dopant having: a second singlet-triplet excitation level difference that is smaller than the first singlet-triplet excitation level difference, a second triplet excitation level that is higher than the first triplet excitation level, and a second singlet excitation level (S1), and a second host to transfer energy to the second singlet excitation level and to suppress Dexter energy transfer from the first dopant.

It is to be understood that both the foregoing general description and the following detailed description of the present disclosure are merely by way of example and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure.

DETAILED DESCRIPTION

Figure 1:
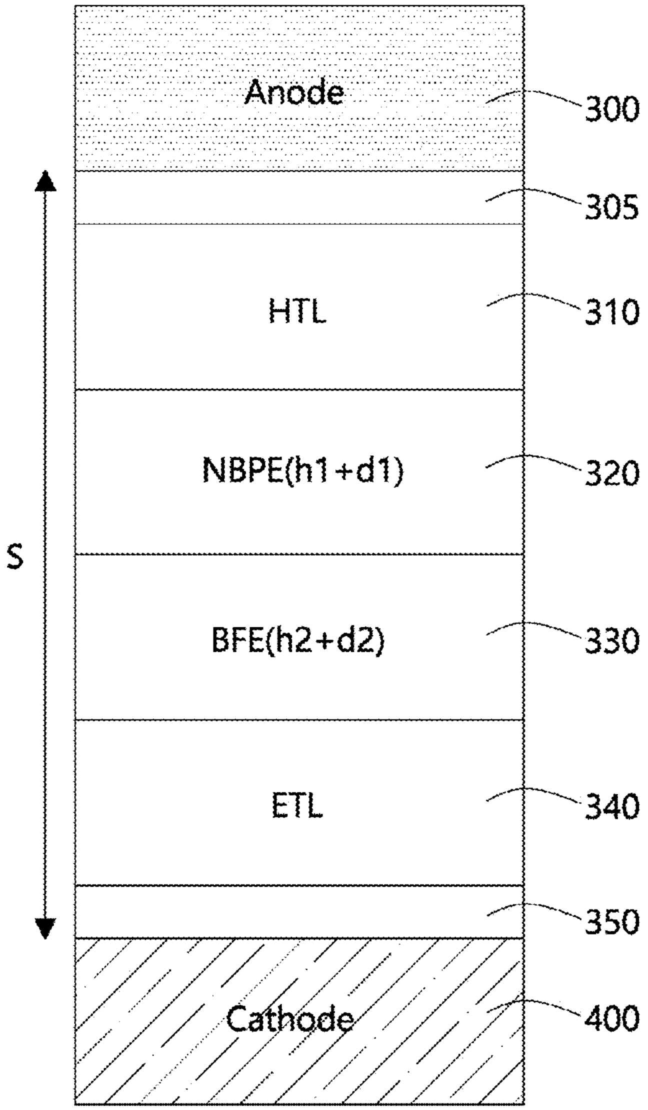
FIG. 1 illustrates a layer structure of a light emitting device according to an example embodiment of the present disclosure.

Reference will now be made in detail to example embodiments of the present disclosure, examples of which are illustrated in the accompanying drawings. Wherever possible, the same reference numbers will be used throughout the drawings to refer to the same or like parts.

Advantages and features of the present disclosure, and a method of achieving the advantages and features will become apparent with reference to the example embodiments described herein in detail together with the accompanying drawings. The present disclosure should not be construed as limited to the example embodiments as disclosed below, and may be embodied in various different forms. Thus, these example embodiments are set forth only to make the present disclosure sufficiently complete, and to assist those skilled in the art to fully understand the scope of the present disclosure. The protected scope of the present disclosure is defined by claims and their equivalents.

The names of elements used in the following description are selected to facilitate understanding of the disclosure, and may differ from the names of the elements in the actual products.

The shapes, sizes, ratios, angles, numbers, and the like, which are illustrated in the drawings to describe various example embodiments of the present disclosure, are merely given by way of example. Therefore, the present disclosure is not limited to the illustrations in the drawings. The same or similar elements are designated by the same reference numerals throughout the specification unless otherwise specified. Further, where the detailed description of the relevant known steps and elements may unnecessarily obscure an important point of the present disclosure, a detailed description of such known steps and elements may be omitted. Furthermore, in the following detailed description of the present disclosure, numerous specific details are set forth in order to provide a sufficiently thorough understanding of the present disclosure. However, it will be understood that the present disclosure may be practiced without these specific details. In other instances, known methods, procedures, components, and circuits have not been described in detail so as not to unnecessarily obscure aspects of the present disclosure.

The terminology used herein is to describe particular aspects and is not intended to limit the present disclosure. As used herein, the terms "a" and "an" used to describe an element in the singular form is intended to include a plurality of elements. An element described in the singular form is intended to include a plurality of elements, and vice versa, unless the context clearly indicates otherwise.

In the present specification, where the terms "comprise," "have," "include," and the like are used, one or more other elements may be added unless the term, such as "only," is used.

In construing an element or numerical value, the element or the numerical value is to be construed as including an error or tolerance range even where no explicit description of such an error or tolerance range is provided.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly connected to or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present. In the description of the various embodiments of the present disclosure, where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used.

In descriptions of temporal relationships, for example, temporal precedent relationships between two events such as "after", "subsequent to", "before", "next," etc., another event may occur therebetween unless a more limiting term, "just," "immediate(ly)," or "direct(ly)" ("directly after", "directly subsequent", "directly before") is indicated.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure may be partially or overall combined with each other, and may be variously inter-operated with each other and driven technically as those skilled in the art can sufficiently understand. The embodiments may be implemented independently of each other and may be implemented together in an co-dependent relationship.

As used herein, the term "doped" layer refers to a layer including a material that accounts for most of the weight of a layer, and a dopant material (for example, n-type and p-type materials, or organic and inorganic substances) having physical properties different from the material that occupies most of the weight ratio of the layer. Apart from the differences in properties, the material and the dopant material may also differ in terms of their amounts in the doped layer. For example, the material that accounts for most of the weight of a layer may be a host material that is a major component while the dopant material may be a minor component. The host material accounts for most of the weight of the doped layer. The dopant material is added in an amount less than 30% by weight, based on a total weight of the host material in the doped layer. A "doped" layer may be a layer that is used to distinguish a host material from a dopant material of a certain layer, in consideration of the weight ratio. For example, if all of the materials constituting a certain layer are organic materials, at least one of the materials constituting the layer is n-type and the other is p-type, when the n-type material is present in an amount of less than 30 wt %, or when the p-type material is present in an amount of less than 30 wt %, the layer is considered to be a "doped" layer.

Also, the term "undoped" refers to layers that are not "doped". For example, a layer may be an "undoped" layer when the layer contains a single material or a mixture including materials having the same properties as each other. For example, if at least one of the materials constituting a certain layer is p-type and none of the materials constituting the layer are n-type, the layer is considered to be an "undoped" layer. For example, if at least one of the materials constituting a layer is an organic material and none of the materials constituting the layer are inorganic materials, the layer is considered to be an "undoped" layer.

Hereinafter, example embodiments of a light emitting device and a light emitting display device including the same will be described with reference to the accompanying drawings.

Figure 2:
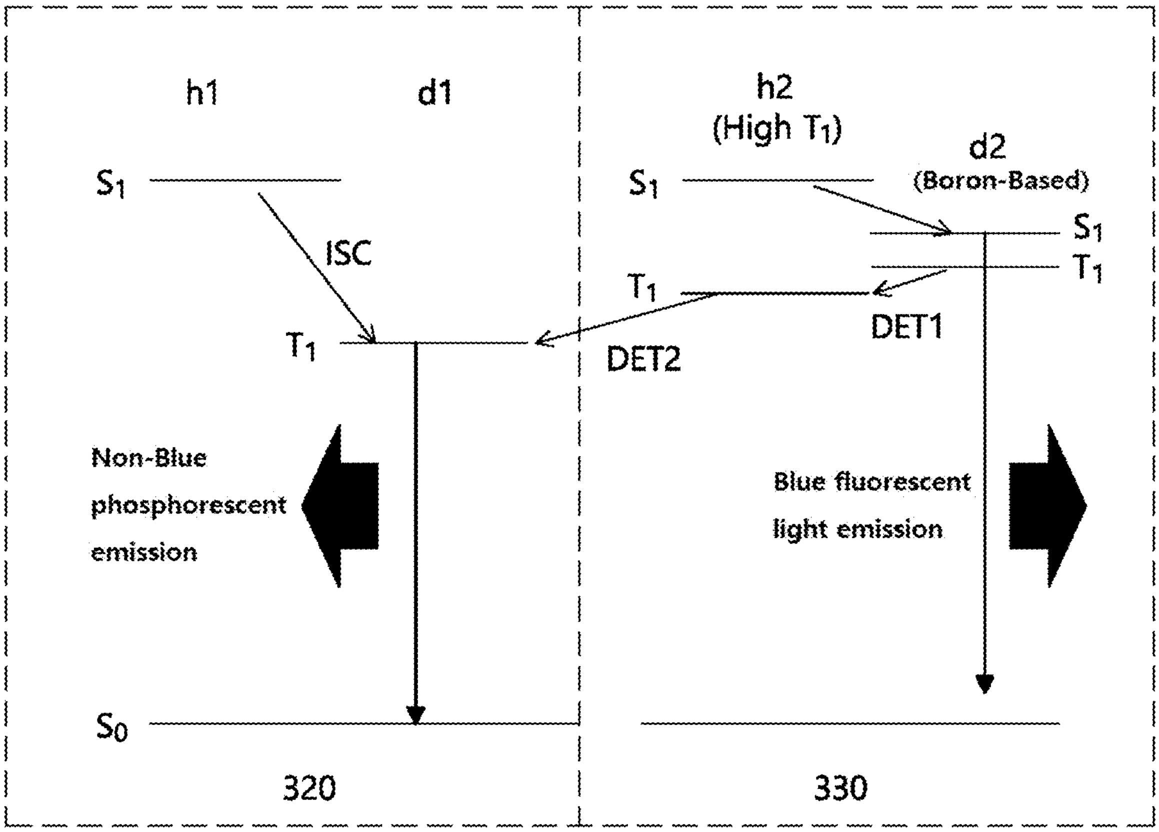
FIG. 2 illustrates energy transfer and light emission mechanism of a non-blue phosphorescent light emitting layer and a blue fluorescent light emitting layer of the example embodiment illustrated in FIG. 1 in the light emitting device according to a first embodiment of the present disclosure.

FIG. 1 illustrates a layer structure of a light emitting device according to an example embodiment of the present disclosure. FIG. 2 illustrates the energy transfer and light emission mechanism of a non-blue phosphorescent light emitting layer and a blue fluorescent light emitting layer of the example embodiment illustrated in FIG. 1 in the light emitting device according to the first embodiment of the present disclosure.

As illustrated in FIG. 1, an example embodiment of the light emitting device as disclosed in the present disclosure includes a first electrode (e.g., anode) 300 and a second electrode (e.g., cathode) 400 that face each other and are spaced apart from each other, a blue fluorescent light emitting layer 330 and a non-blue phosphorescent light emitting layer 320 that are in contact with each other between the first electrode 300 and the second electrode 400, a first common layer between the first electrode 300 and the non-blue phosphorescent light emitting layer 320, and a second common layer between the second electrode 400 and the blue fluorescent light emitting layer 330. One of the first electrode 300 and the second electrode 400 may be located in the lower region and contact the substrate. The other of the first electrode 300 and the second electrode 400 may be located in the upper region.

The first common layer may include a hole injection layer 305 and a hole transport layer 310. The first common layer may function to inject holes from the first electrode 300 and transport the holes to the non-blue phosphorescent light emitting layer 320. In addition to the hole injection layer 305 and the hole transport layer 310, the first common layer may further include an electron blocking layer to prevent electrons or reduce the amount of electrons from passing from the non-blue phosphorescent light emitting layer 320 to the hole transport layer 310 or a hole control layer to control the movement speed of holes.

The second common layer may include an electron transport layer 340 and an electron injection layer 350. The second common layer may function to inject electrons from the second electrode 400 and transport the electrons to the blue fluorescent light emitting layer 330. In addition, the second common layer may further include a hole blocking layer to prevent holes or reduce the amount of holes from escaping from the blue fluorescent light emitting layer 330, or an electron control layer to control the movement speed of electrons from the second electrode 400.

When only the blue fluorescent light emitting layer 330 and a non-blue phosphorescent light emitting layer 320 are provided between the electrodes, there is a large energy barrier between the light emitting layers 320 and 330 and each electrode. This phenomenon may increase the driving voltage and may make it difficult to supply holes and electrons to the blue fluorescent light emitting layer 330 and a non-blue phosphorescent light emitting layer 320. For this reason, the first and second common layers for transporting holes and electrons are provided to enhance hole and electron transport properties. In addition to the layers described above, the first and second common layers may further include an additional layer in consideration of hole transport and electron transport properties or carrier distribution for light emitting devices.

The example embodiment of the light emitting device illustrated in FIG. 1 has a structure in which a plurality of light emitting layers come into contact with one another between the first and second electrodes 300 and 400 that face each other. In some embodiments, the first electrode 300 may be located in the lower region and the second electrode 400 may be located in the upper region. Alternatively, the first electrode 300 may be located in the upper region and the second electrode 400 may be located in the lower region.

Also, the element represented by "S" in FIG. 1 is an internal stack including an organic material between the first electrode 300 and the second electrode 400. The internal stack S may be connected to another stack through a charge generating layer or the like.

Here, the non-blue phosphorescent light emitting layer 320 and the blue fluorescent light emitting layer 330 in contact with each other emit phosphorescent and fluorescent light, respectively. In addition, in an example embodiment of the light emitting device as disclosed in the present disclosure, different materials are used for the host and the dopant constituting the light emitting layers 320 and 330 so that light of different colors may be possible with a single light emitting device.

A tandem device that may have high color purity and high efficiency may require blue high efficiency. Example embodiments of the light emitting device as disclosed in the present disclosure aim to maximize or increase quantum efficiency in each light emitting layer. Non-emission loss may be prevented or reduced without the blue light emitting efficiency deteriorating due to energy transfer from the blue fluorescent light emitting layer 330 to the non-blue phosphorescent light emitting layer 320 adjacent thereto. High phosphorescence efficiency in the non-blue phosphorescent light emitting layer 320 may be maintained by combining the blue fluorescent light emitting layer 330 with the non-blue phosphorescent light emitting layer 320.

The non-blue phosphorescent light emitting layer 320 may be, for example, a red phosphorescent light emitting layer, a yellow-green phosphorescent light emitting layer, or a green phosphorescent light emitting layer. In an example embodiment, the non-blue phosphorescent light emitting layer 320 is a red phosphorescent light emitting layer and may have an emission peak at a wavelength of 600 nm to 650 nm. In an example embodiment, the non-blue phosphorescent light emitting layer 320 is a green phosphorescent light emitting layer and may have an emission peak at a wavelength of 510 nm to 575 nm. In an example embodiment, the non-blue phosphorescent light emitting layer 320 is a yellow-green phosphorescent light emitting layer and may have an emission peak at a wavelength of 540 nm to 610 nm.

The non-blue phosphorescent light emitting layer 320 includes a first host h1 and a first dopant d1 capable of emitting phosphorescent light with a longer wavelength than blue light. The first host h1 may be selected from the group of materials capable of transferring energy to the first dopant d1 so that excitons formed by recombination of holes and electrons supplied to the non-blue phosphorescent light emitting layer 320 act at the triplet excitation level T1 of the first dopant d1 and may be used for light emission. The first dopant d1 may be a metal complex containing a metal such as iridium (Ir), platinum (Pt), or beryllium (Be) as a core.

The term "triplet excitation level (T1)," as used herein, corresponds to the energy level for a triplet in an excited state. The term "singlet excitation level (S1)," as used herein, corresponds to the energy level for a singlet in an excited state. A phosphorescent dopant emits phosphorescent light when energy is released as the phosphorescent dopant relaxes from a triplet excitation level to a ground state. A fluorescent dopant emits fluorescent light when energy is released as the fluorescent dopant relaxes from a singlet excitation level to a ground state.

The blue fluorescent light emitting layer 330 includes a second host h2 and a second dopant d2 capable of emitting blue fluorescent light. The blue light emitted from the blue fluorescent light emitting layer 330 may have an emission peak at a wavelength of 430 nm to 480 nm. To prevent or reduce the chances of the energy supplied through Dexter energy transfer from the adjacent non-blue phosphorescent light emitting layer 320 from being lost without being used for light emission in the blue light emitting layer 330, the second host h2 may include a material that has a triplet excitation level between the triplet excitation level of the first dopant d1 and the triplet excitation level of the second dopant d2 of the non-blue phosphorescent light emitting layer 320, as illustrated in FIG. 2. The second dopant d2 has a higher triplet excitation level than the second host h2. The second dopant d2 has a small difference (ΔEst) between the singlet excitation level and the triplet excitation level. For the objects of the present disclosure, the second dopant d2 may include a boron-based dopant. Examples of the boron-based dopant include materials represented by Formulas 1 to 9. The examples are provided for illustration. Any material may be used so long as it is a boron-based compound, emits blue light, and has a higher triplet excitation level than the triplet excitation level of the second host h2.

[Formula 1]

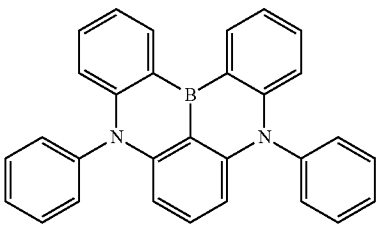

[Formula 2]

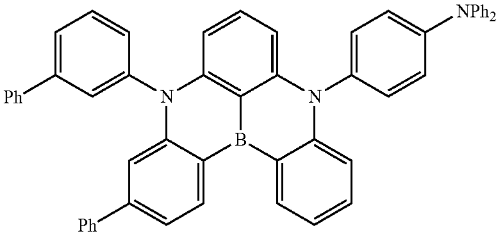

[Formula 3]

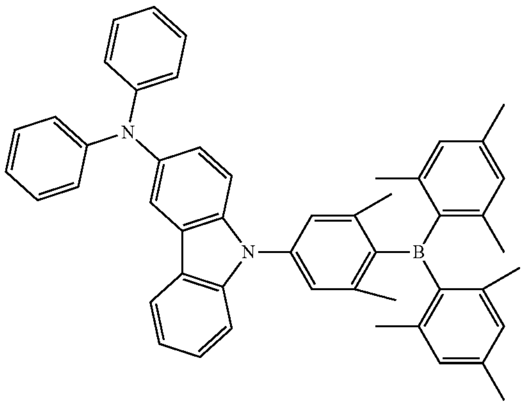

-continued

[Formula 4]

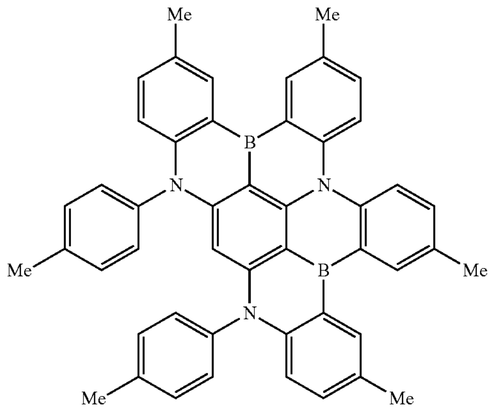

[Formula 5]

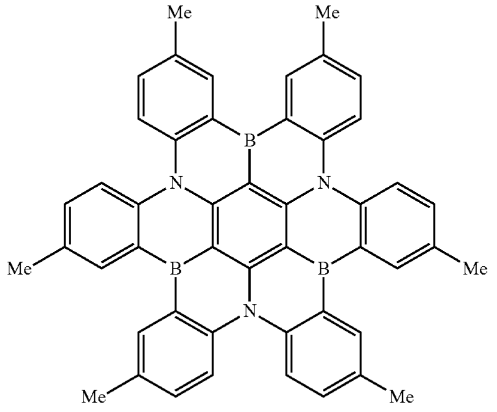

[Formula 6]

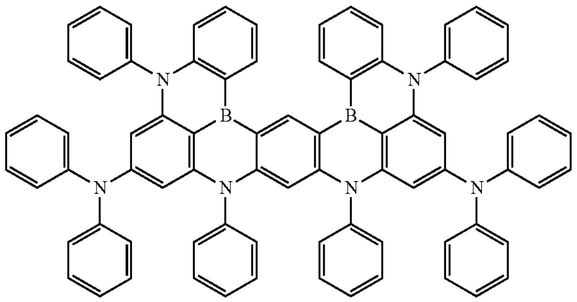

[Formula 7]

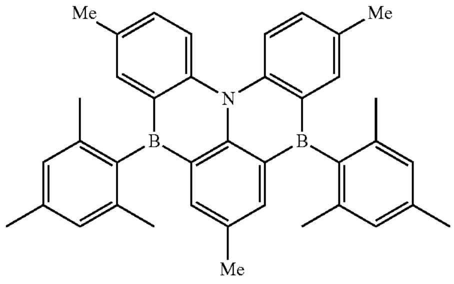

-continued

[Formula 8]

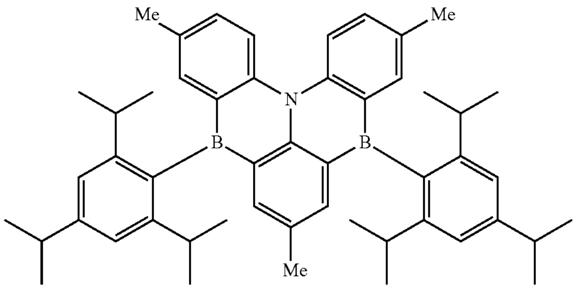

[Formula 9]

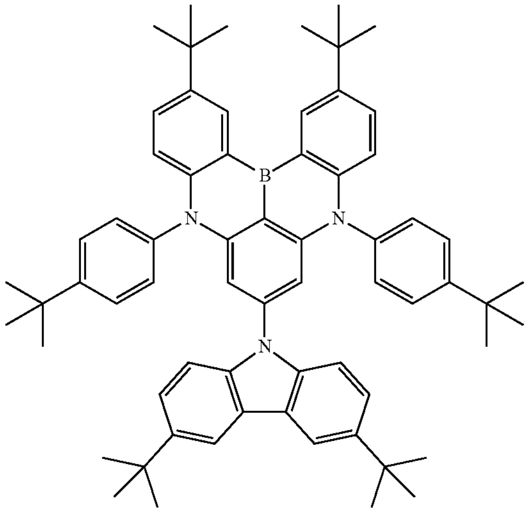

As illustrated in FIG. 2, the triplet excitation level of the second host h2 lies between the first dopant d1 and the second dopant d2. In an example embodiment, the triplet excitation level of the second host h2 may be 2.1 eV to 2.4 eV. This aims to reduce the ratio of excitons lost rather than being used for light emission in the blue fluorescent light emitting layer 330 when Dexter energy transfer occurs at the triplet excitation level between the non-blue phosphorescent light emitting layer 320 and the blue fluorescent light emitting layer 330. The non-blue phosphorescent light emitting layer 320 may be designed in consideration of phosphorescence and the emission of phosphorescent light when an energy of the triplet excitons at the triplet excitation level of the first dopant d1 is released when the first dopant d1 relaxes to the ground state.

In an example embodiment, the triplet excitation level of the first dopant d1 is higher than the triplet excitation level of the second host h2 or the second dopant d2 of the blue fluorescent light emitting layer 330 adjacent thereto, Dexter energy transfer to the blue fluorescent light emitting layer 330 occurs, and excitons are transferred from the non-blue phosphorescent light emitting layer 320 to the blue fluorescent light emitting layer, but cannot be used for fluorescent light emission due to the low triplet excitation level of the material constituting the blue fluorescent light emitting layer, and is emitted as a heat energy rather than being used for light emission at the triplet excitation level of each material.

The light emitting device according to the first embodiment of the present disclosure is designed such that the triplet excitation level of the second host h2 or the second dopant d2 of the blue fluorescent light emitting layer 330 is higher than the first dopant of the non-blue phosphorescent light emitting layer 320, thereby preventing or reducing Dexter energy transfer from a high triplet energy level to a low triplet energy level between the non-blue phosphorescent light emitting layer 320 and the blue fluorescent light emitting layer 330 due to the energy difference. Based on this, upon receiving Dexter energy transferred to the blue fluorescent light emitting layer, excitons that are lost rather than being used for light-emission at the triplet excitation level of the second host may be prevented or reduced. In addition, the blue fluorescent light emitting layer 330 emits fluorescent light when singlet excitons fall from the singlet excitation level to the ground state at a ratio of a triplet to a singlet of 3:1, and the second host h2 also emits fluorescent light when the energy of the singlet excitons at the singlet excitation level S1 of the second dopant d2 drops to the ground state through interaction between two triplets based on TTF (triplet-triplet fusion), thus improving the luminous efficacy of the fluorescent light emitting layer 330.

The excitons may be moved through first Dexter energy transfer (DET1) from the triplet energy level of the second dopant d2 to the triplet energy level of the second host h2 of the blue fluorescent light emitting layer 330, and through second Dexter energy transfer (DET2) from the triplet energy level of the second host h2 to the triplet energy level of the non-blue phosphorescent light emitting layer 320. In this case, all or most of the excitons transferred to the non-blue phosphorescent light emitting layer 320 may be used for phosphorescent light emission at the triplet excitation level of the first dopant d1, thereby maximizing internal quantum efficiency.

The second host used for the light emitting device according to the first embodiment of the present disclosure is, for example, a compound that has a triplet excitation level T1 between the triplet excitation level of the first dopant d1 and the triplet excitation level of the second dopant d2 and the compound may, for example, include a moiety represented by Formula 10 as an end group thereof. In addition, the second host h2 may include at least one of carbazole, fluorene, triazine, and quinazoline in addition to the end group represented by Formula 10.

[Formula 10]

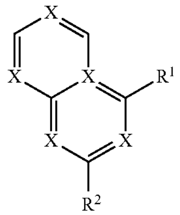

X represents any one of carbon, nitrogen and boron.

$R^1$ and $R^2$ are each independently selected from the group consisting of a substituted or unsubstituted aryl group having 6 to 24 carbon atoms, a substituted or unsubstituted heteroaryl group, a substituted or unsubstituted condensed aryl group having 10 to 30 carbon atoms, a substituted or unsubstituted heteroaryl group having 2 to 24 carbon atoms, a substituted or unsubstituted alkyl group having 1 to 24 carbon atoms, a substituted or unsubstituted heteroalkyl group having 1 to 24 carbon atoms, a substituted or unsubstituted cycloalkyl group having 3 to 24 carbon atoms, a substituted or unsubstituted alkoxy group having 1 to 24 carbon atoms, a substituted or unsubstituted aryloxy group having 1 to 24 carbon atoms, a substituted or unsubstituted alkylsilyl group having 1 to 24 carbon atoms, a substituted or unsubstituted arylsilyl group having 6 to 24 carbon atoms, a cyano group, a halogen group, deuterium and hydrogen, and $R^1$ and $R^2$ may each independently form a condensed ring with a neighboring substituent.

In addition, examples of the second host may include compounds represented by the following Formulas 11 and 12.

[Formula 11]

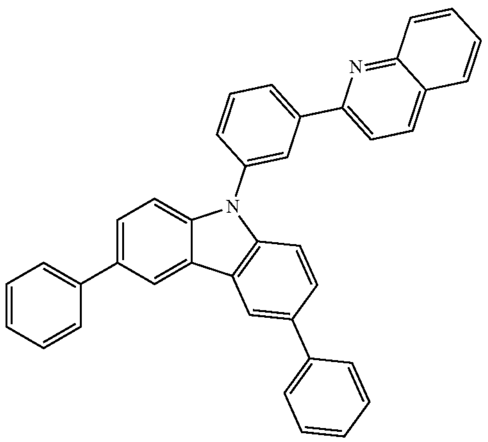

[Formula 12]

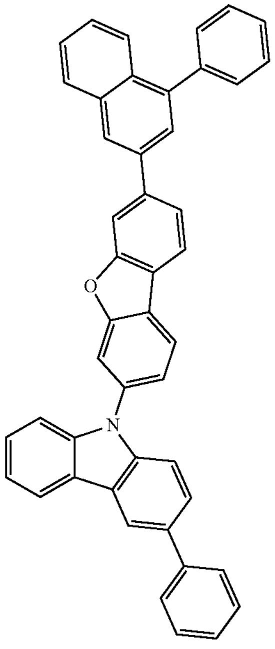

In the light emitting device according to the first embodiment of the present disclosure, the above-described examples represented by Formulas 11 and 12 as the second host (h2) are provided merely for illustration and any material may be used so long as it has a triplet excitation level between the first dopant d1 and the second dopant d2, and functions to help fluorescent emission by excitation in the second dopant d2.

In an example embodiment of the light emitting device as disclosed in the present disclosure, the non-blue phosphorescent light emitting layer 320 and the blue fluorescent light emitting layer 330 come into contact with each other. In some embodiments, a voltage applied to the first and second electrodes 300 and 400 on both sides of the non-blue phosphorescent light emitting layer 320 and the blue fluorescent light emitting layer 330 generates a current, and excitons formed by recombination of holes and electrons that have migrated to the non-blue phosphorescent light emitting layer 320 and the blue fluorescent light emitting layer 330 are distributed to both the non-blue phosphorescent light emitting layer 320 and the blue fluorescent light emitting layer 330. Thus, light emission may be observed. Therefore, compared to a structure in which a single light emitting layer is used as a light emitting layer in one stack or in two electrodes facing each other, light emission is be performed with excitons distributed to the two light emitting layers 320 and 330. Therefore, it is important to increase the efficiency of each light emitting layer.

In an example embodiment, two light emitting layers, the non-blue phosphorescent light emitting layer 320 and the blue fluorescent light emitting layer 330 come into contact. The thickness of each of the light emitting layers or the content of the first and second dopants d1 and d2 in each of the light emitting layers 320 and 330 may be controlled so that the distribution of excitons acting on each of the light emitting layers 320 and 330 may be different.

Hereinafter, the internal quantum efficiency relating to the amount of excitons being used for light emission relative to the content of excitons distributed to the non-blue phosphorescent light emitting layer 320 and the blue fluorescent light emitting layer 330 will be described.

Figure 3A:
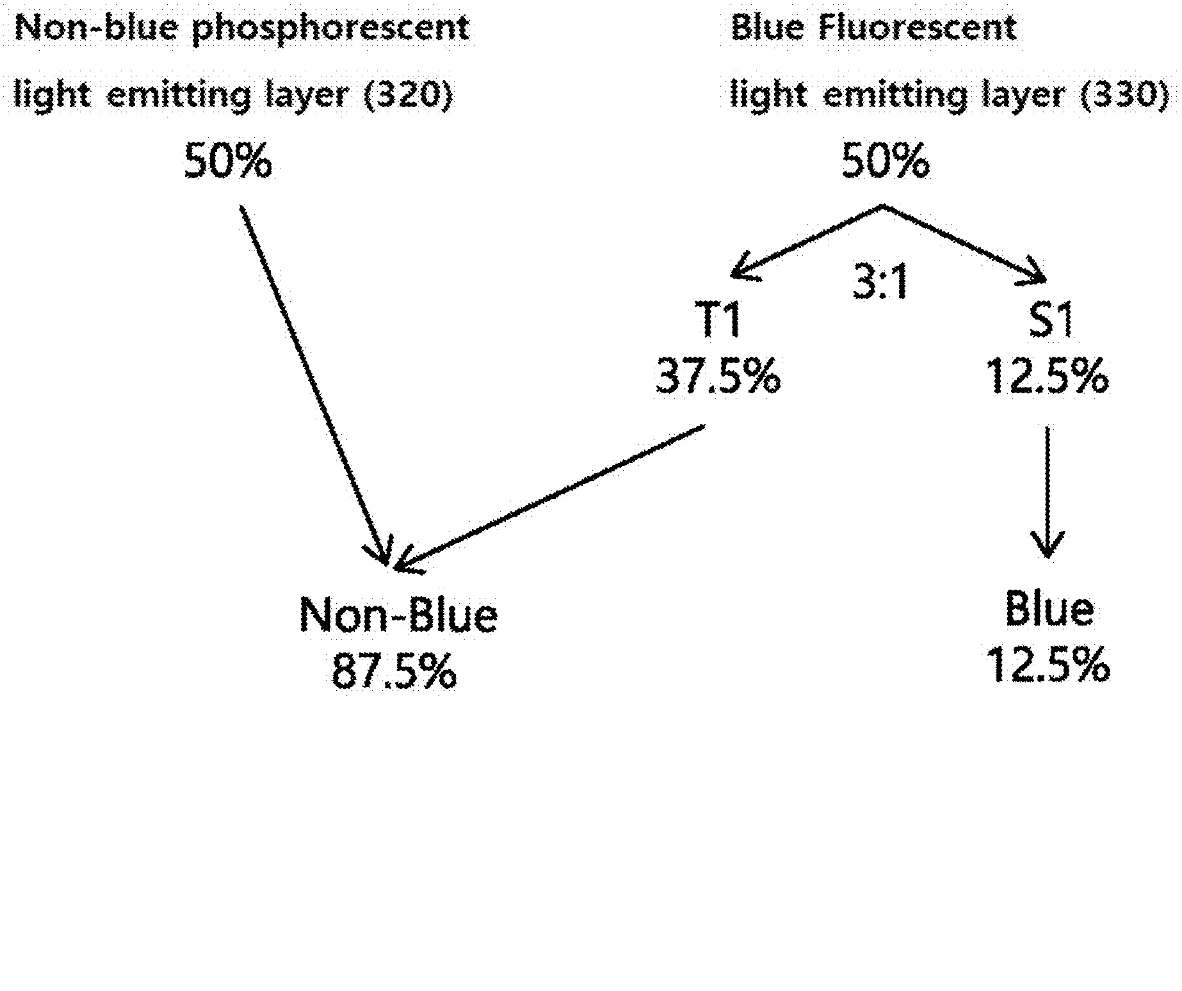
FIGS. 3A to 3C illustrate the internal quantum efficiency of each light emitting layer depending on the exciton ratio of the non-blue phosphorescent light emitting layer to the blue fluorescent light emitting layer in an example embodiment of the light emitting device based on the light-emission mechanism illustrated in FIG. 2.
Figure 3B:
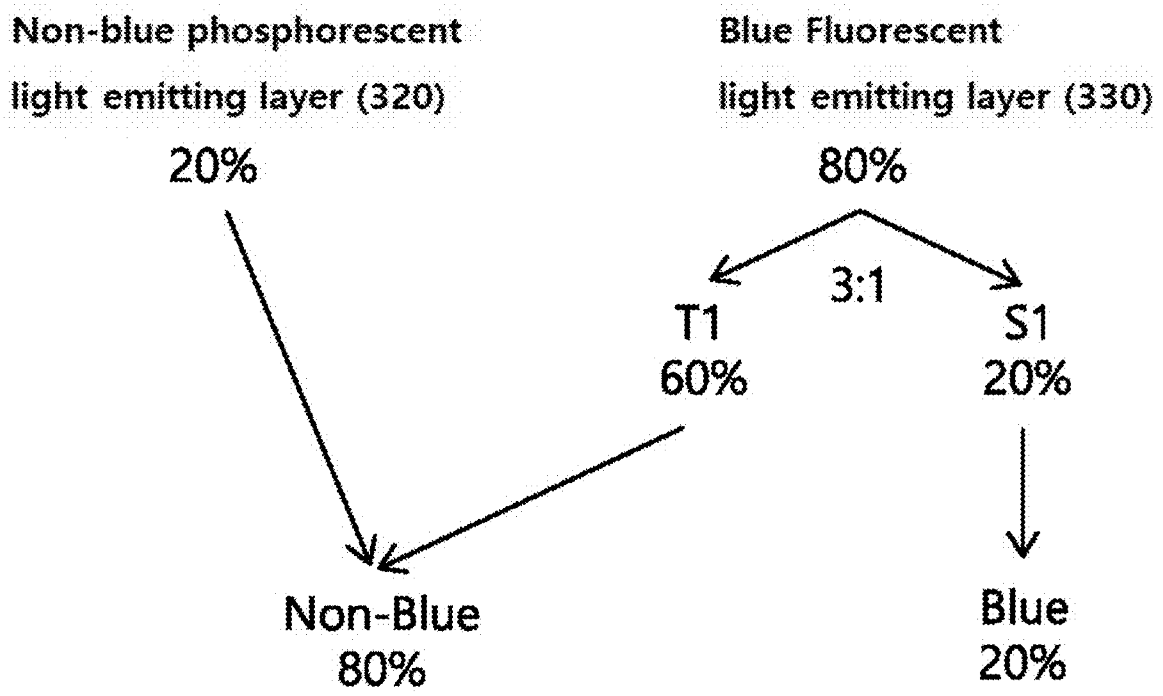
Figure 3C:
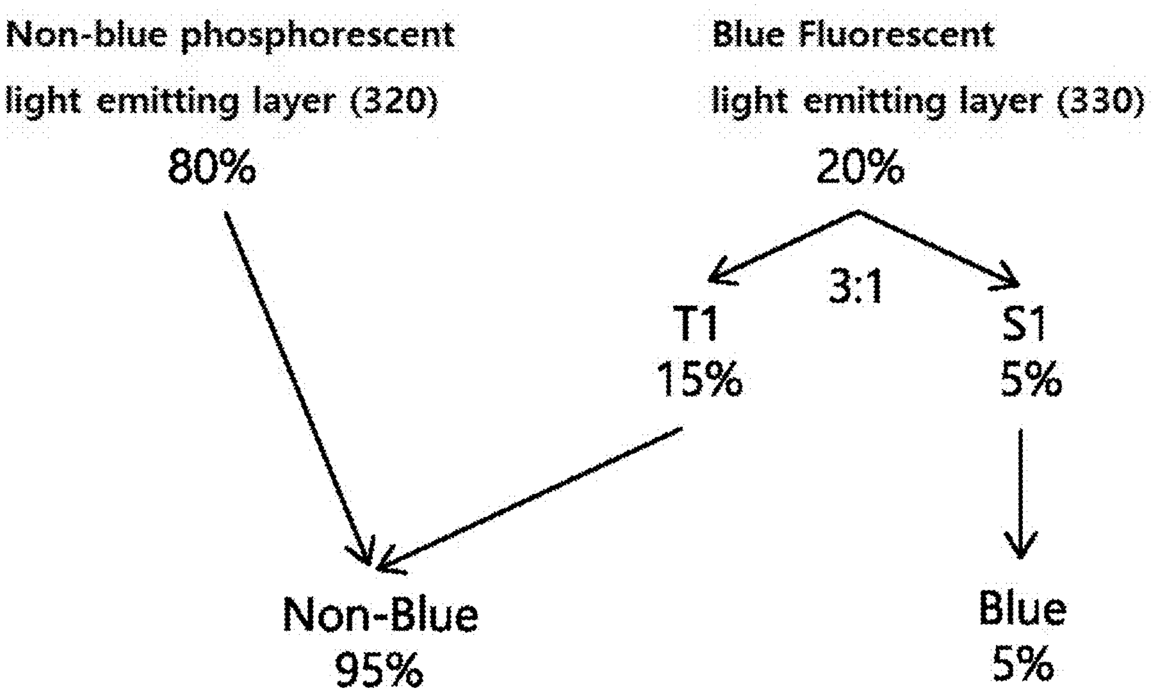

FIGS. 3A to 3C illustrate the internal quantum efficiency of each light emitting layer depending on the exciton ratio of the non-blue phosphorescent light emitting layer and the blue fluorescent light emitting layer in an example embodiment of the light emitting device based on the light-emission mechanism illustrated in FIG. 2.

As illustrated in FIG. 3A, the exciton distribution ratio of the non-blue phosphorescent light emitting layer 320 to the blue fluorescent light emitting layer 330 is adjusted to 50%:50%. The exciton distribution ratio may be adjusted through control of the thickness ratio of the non-blue phosphorescent light emitting layer 320 and the blue fluorescent light emitting layer 330. The exciton distribution ratio may be adjusted through the content of the first and second dopants d1 and d2. Singlets at the singlet excitation level S1 of the blue fluorescent light emitting layer 330 contribute to blue fluorescence at a ratio of triplets to singlets of 3:1. The blue fluorescent light emitting layer 330 has an internal quantum efficiency of 12.5%, as calculated from 50%*¼.

In the non-blue phosphorescent light emitting layer 320, all or most of the supplied excitons may contribute to phosphorescent light emission. At the same time, the triplets in the blue fluorescent light emitting layer 330 may be transferred through the first Dexter energy transfer (DET1) from the second dopant d2 to the second host h2, and then may be transferred through the second Dexter energy transfer (DET2) from the second host h2 to the triplet excitation level of the non-blue phosphorescent light emitting layer 320. 50% of the excitons supplied to the non-blue phosphorescent light emitting layer 320 and 37.5% (as calculated from 50%*¾) of the triplets supplied through Dexter energy transfer from the blue fluorescent light emitting layer 330 may contribute to phosphorescence. The non-blue phosphorescent light emitting layer 320 may receive triplets having a long relaxation time through Dexter energy transfer from the blue fluorescent light emitting layer 330. Thus, The non-blue phosphorescent light emitting layer 320 may have an internal quantum efficiency of 87.5% (50%+37.5%), and may realize phosphorescent emission of the color of light emitted by the first dopant d1.

The light emitting device according to the first embodiment of the present disclosure may have a configuration in which the non-blue phosphorescent light emitting layer 320 contributes to light emission at an efficiency of 87.5% and the blue fluorescent light emitting layer 330 contributes to light emission at an efficiency of 12.5%, excluding excitons not used for light emission to set the internal quantum efficiency to 100%.

FIG. 3B relates to an example embodiment in which the thickness of the blue fluorescent light emitting layer 330 is increased as compared to the non-blue phosphorescent light emitting layer 320, different from in the example embodiment illustrated in FIG. 3A. Alternatively, the content of the second dopant d2 of the blue fluorescent light emitting layer 330 is increased compared to the example embodiment illustrated in FIG. 3A. As illustrated in FIG. 3B, excitons are further concentrated in the blue fluorescent light emitting layer 330 by setting an exciton ratio of the non-blue phosphorescent light emitting layer 320 to the blue fluorescent light emitting layer 330 to 20%:80%. Singlets at the singlet excitation level S1 of the blue fluorescent light emitting layer 330 may contribute to blue fluorescence at a ratio of triplets to singlets of 3:1. The blue fluorescent light emitting layer 330 may have an internal quantum efficiency of 20%, as calculated from 80%*¼. By increasing the internal quantum efficiency of the blue fluorescent light emitting layer 330, the efficiency of blue in the example embodiment of the light emitting device may be further improved.

The non-blue phosphorescent light emitting layer 320 is capable of emitting phosphorescent light, based on 20% of the supplied excitons and triplets transferred through Dexter energy transfer DET1 and DET2 from the second dopant d2 and the second host h2 of the blue fluorescent light emitting layer 330. The non-blue phosphorescent light emitting layer 320 may have an internal quantum efficiency of 80%, as calculated from 20%+80%*¾.

FIG. 3C relates to an example embodiment in which the thickness of the non-blue phosphorescent light emitting layer 320 is increased as compared the blue fluorescent light emitting layer 330, different from the example embodiment illustrated in FIG. 3B. Alternatively, the content of the first dopant d1 of the non-blue phosphorescent light emitting layer 320 is increased compared to the example embodiment illustrated in FIG. 3A. As illustrated in FIG. 3B, excitons are further concentrated in the non-blue phosphorescent light emitting layer 320 by setting an exciton ratio of the non-blue phosphorescent light emitting layer 320 to the blue fluorescent light emitting layer 330 to 80%:20%. Singlets at the singlet excitation level S1 of the blue fluorescent light emitting layer 330 may contribute to blue fluorescence at a ratio of triplets to singlets of 3:1. The blue fluorescent light emitting layer 330 may have an internal quantum efficiency of 5%, as calculated from 20%*¼. In this case, the non-blue phosphorescent light emitting layer 320 is capable of emitting phosphorescent light, based on 80% of the supplied excitons and triplets transferred through Dexter energy transfer DET1 and DET2 from the second dopant d2 and the second host h2 of the blue fluorescent light emitting layer 330. The non-blue phosphorescent light emitting layer 320 may have an internal quantum efficiency of 95%, as calculated from 80%+20%*¾.

The example embodiments illustrated in FIGS. 3A to 3C are different from one another in the controlled initial charge ratio of the non-blue phosphorescent light emitting layer 320 and the blue fluorescent light emitting layer 330. In all or most of the example embodiments illustrated in FIGS. 3A to 3C, as shown in Table 1, the triplets, which may not contribute to light emission in the blue fluorescent light emitting layer 330, among excitons distributed based on the charge ratio in an initial state, may not be lost in a non-emission mode in the blue fluorescent light emitting layer 330. The triplets in the blue fluorescent light emitting layer 330 may be transferred to the adjacent non-blue phosphorescent light emitting layer 320 and contribute to phosphorescent light emission so that maximum efficiency of excitons, as shown in Table 1, may be achieved in a structure in which the light emitting layers are adjacent to each other. In example embodiments of the light emitting device that includes an additional stack other than the stack S including the first common layer CML1, the non-blue phosphorescent light emitting layer 320, the blue fluorescent light emitting layer 330, and the second common layer CML2 between the first and second electrodes 300 and 400, the initial exciton ratio of the blue fluorescent light emitting layer 330 may be increased as illustrated in FIG. 3B. Alternatively, in some example embodiments, the initial exciton ratio of the non-blue phosphorescent light emitting layer 320 may be increased as illustrated in FIG. 3C.

TABLE 1

| Item | FIG. 3A | FIG. 3B | FIG. 3B |
|---|---|---|---|
| Initial exciton ratio (320:330) | 50%:50% | 20%:80% | 80%:20% |
| Internal quantum efficiency | IQE | IQE | IQE |
| Non-blue phosphorescent light emitting layer (320) | 87.5% | 80% | 95% |
| Blue fluorescent light emitting layer (330) | 12.5% | 20% | 5% |
| Total efficiency of light emitting layers | 100% | 100% | 100% |

In the above-described first embodiment, the triplet excitation level of the second dopant is 2.4 eV or more.

The light emitting device according to the first embodiment of the present disclosure described above uses a fluorescent blue dopant and a fluorescent blue host having a high triplet energy level compared to the phosphorescent dopant. In this case, the triplet excitons at the triplet energy level of the fluorescent dopant may be transferred to the triplet energy level of the fluorescent host through Dexter energy transfer. Such triplet excitons may be transferred to the triplet energy level of the phosphorescent dopant of the adjacent non-blue (e.g., red) phosphorescent light emitting layer through Dexter energy transfer and may contribute to red light emission.

Hereinafter, a light emitting device according to the comparative embodiment in which Dexter energy transfer occurs from the non-blue phosphorescent light emitting layer to the blue fluorescent light emitting layer will be described.

Figure 4:
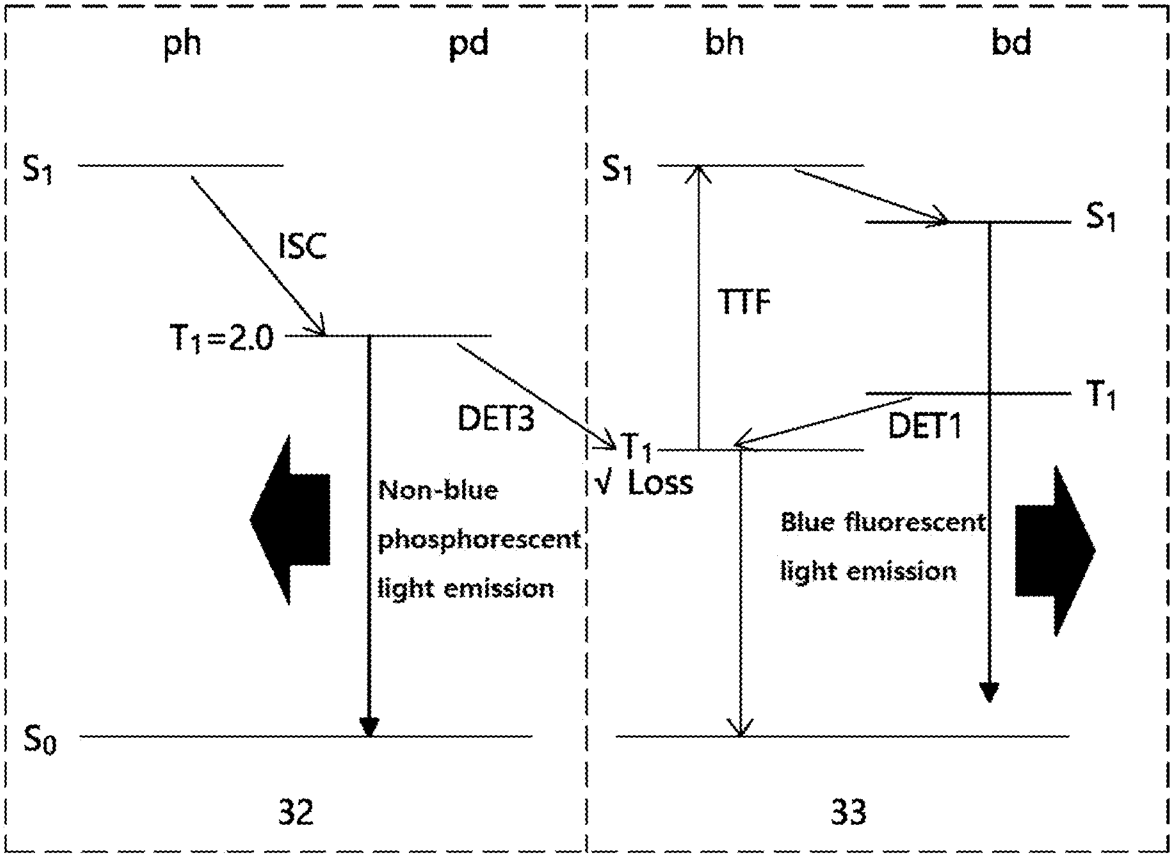
FIG. 4 illustrates energy transfer and light emission mechanism of a non-blue phosphorescent light emitting layer and a blue fluorescent light emitting layer in the light emitting device according to a comparative embodiment of the present disclosure.
Figure 5:
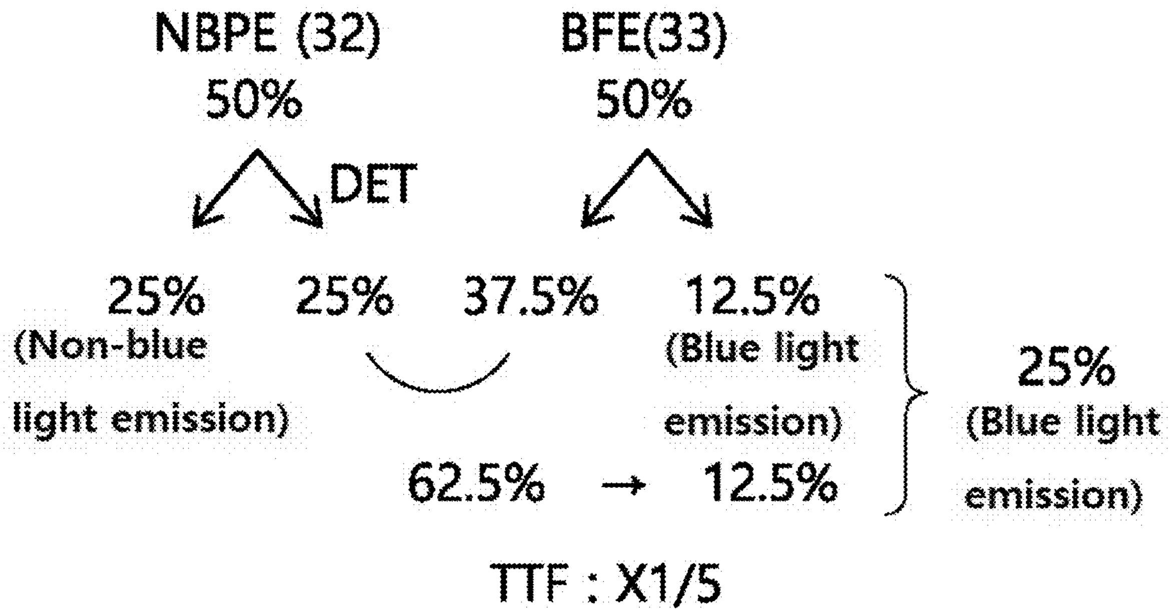
FIG. 5 illustrates the internal quantum efficiency of each light emitting layer depending on the exciton ratio of the non-blue phosphorescent light emitting layer to the blue fluorescent light emitting layer in an example of the light emitting device based on the light-emission mechanism illustrated in FIG. 4.

FIG. 4 illustrates the energy transfer and light emission mechanism of a non-blue phosphorescent light emitting layer and a blue fluorescent light emitting layer in the light emitting device according to the comparative embodiment of the present disclosure. FIG. 5 illustrates the internal quantum efficiency of each light emitting layer depending on the exciton ratio of the non-blue phosphorescent light emitting layer to the blue fluorescent light emitting layer in an example embodiment of the light emitting device based on the light-emission mechanism illustrated in FIG. 4.

As illustrated in FIG. 4, the light emitting device according to the comparative embodiment has a layer structure similar to the example embodiment illustrated in FIG. 1. The light emitting layer in the comparative example has a non-blue phosphorescent light emitting layer 32 including a phosphorescent host ph and a phosphorescent dopant pd, and a blue fluorescent light emitting layer 33 including a blue host bh and a blue dopant bd. The non-blue phosphorescent light emitting layer 32 and the blue fluorescent light emitting layer 33 come into contact with each other. The blue host bh and the blue dopant bd of the blue fluorescent light emitting layer 33 have a triplet excitation level lower than that of the phosphorescent dopant pd of the non-blue phosphorescent light emitting layer 32.

The non-blue phosphorescent light emitting layer 32 of the light emitting device according to the comparative embodiment used the first host and the first dopant of the non-blue phosphorescent light emitting layer described in connection with the example embodiments illustrated in FIGS. 1 and 2.

The light emitting device according to the comparative embodiment uses, as the materials of the blue fluorescent light emitting layer 33, an anthracene-based host and a pyrene-based dopant used in the blue light emitting layer of a single blue light emitting device.

As illustrated in FIG. 4, both the anthracene-based host (e.g., bh) and the pyrene-based dopant (e.g., bd) of the light emitting device according to the comparative embodiment have a triplet excitation level lower than the triplet excitation level of the non-blue phosphorescent light emitting layer. Accordingly, in the light emitting device according to the comparative embodiment, Dexter energy transfer may occur from the phosphorescent dopant pd of the non-blue phosphorescent light emitting layer to the blue host bh. The energy supplied through Dexter energy transfer from the blue dopant to the triplet state of the blue host may release when the blue host relaxes to the ground state. At this time, the energy may be used for heat emission rather than light emission. Among the excitons supplied to the light emitting layers 32 and 33, the excitons transferred to the triplet state of the blue host do not contribute to light emission. Thus, internal quantum efficiency may be reduced.

As illustrated in FIG. 5, when the initial exciton ratio of the non-blue phosphorescent light emitting layer 32 to the blue fluorescent light emitting layer 33 in the light emitting device according to the comparative embodiment is 50%: 50%, and Dexter energy transfer may occur in the non-blue phosphorescent light emitting layer 32 in ½ of the supplied excitons, phosphorescence may be generated by ½ of the remaining excitons. The internal quantum efficiency for phosphorescence is 25%, as calculated from 50%*½.

In addition, energy may be transferred to the triplet level of the blue host of the blue fluorescent light emitting layer 33 through Dexter energy transfer by the remaining 25% excitons in the non-blue phosphorescent light emitting layer 32. Therefore, the blue fluorescent light emitting layer 33 may generate 12.5% of fluorescence by the singlet component corresponding to ¼ of the 50% of the supplied excitons due to the 1:3 generation ratio of the internal singlet to the triplet in the blue dopant. A part of the 62.5%, as calculated from 50*¾+25%, of triplets supplied through Dexter energy transfer from the blue dopant and the non-blue phosphorescent dopant to the triplet excitation level of the blue host is energy-transferred into singlets by triplet-triplet fusion (TTF). The energy may be transferred to the singlet excitation level of the blue dopant, which may be used for fluorescence. Here, TTF occurs at approximately ⅕ of the triplet excitation level of the host. Therefore, the efficiency of additional fluorescence emission by TTF may be 12.5%, as calculated from 62.5%*⅕.

Therefore, in the light emitting device according to the comparative embodiment, and as illustrated in FIG. 5 and Table 2, 25% (12.5%+12.5%) of the excitons supplied to the light emitting device may be used for light emission in the blue fluorescent light emitting layer 33 and 25% of the excitons supplied to the light emitting device may be used for light emission in the non-blue phosphorescent light emitting layer 32.

TABLE 2

| Item | FIG. 5 |
|---|---|
| Initial exciton ratio (32:33) | Non-blue phosphorescent light emitting layer (50%):blue fluorescent light emitting layer(50%) |
| Internal quantum efficiency | IQE |
| Non-blue phosphorescent light emitting layer (32) | 25% |
| Blue fluorescent light emitting layer (33) | 25% |
| Total efficiency of light emitting layers | 50% |

The light emitting device according to the comparative embodiment may be considered to have a higher internal quantum efficiency of the blue fluorescent light emitting layer compared to the light emitting device as disclosed in the present disclosure because, in the comparative embodiment, Dexter energy transfer may occur from the non-blue phosphorescent light emitting layer 32 to the adjacent blue fluorescent light emitting layer 33. In the comparative embodiment, the triplets at the triplet excitation level of the blue host participate in TTF of ⅕ level during the initial operation. But as time passes, the triplets may react with one another and may be annihilated due to TTA (triplet-triplet annihilation) or the like. Alternatively, triplets may remain in a non-light emission state in the light emitting layer 33 and function to inhibit fluorescence emission, which may shorten the lifespan. For example, ⅘ of the triplets in the triplet energy level of the blue host do not emit light due to the structural triplet energy level difference between the material of the non-blue phosphorescent light emitting layer 32 and the blue fluorescent light emitting layer 33. Considering that the internal quantum efficiency may be low and the internal quantum efficiency of the blue fluorescent light emitting layer is ⅕, in a structure where the non-blue phosphorescent light emitting layer and the blue fluorescent light emitting layer are adjacent to each other, it may be difficult to obtain a uniform efficiency of the two light emitting layers. Excitons that remain unused for light emission in the blue fluorescent light emitting layer may inhibit light emission.

In the light emitting device according to the first embodiment of the present disclosure, the second host and the second dopant of the blue fluorescent light emitting layer 330 may be designed to have a higher excitation level than that of the first dopant of the non-blue phosphorescent light emitting layer 320, different from the light emitting device of the comparative embodiment. In some example embodiments, Dexter energy transfer from the non-blue phosphorescent light emitting layer 320 to the blue fluorescent light emitting layer 330 may be prevented or reduced. A decrease in internal quantum efficiency due to the triplets lost without being used for light emission at the triplet excitation level of the second host, as described in connection with the light emitting device of the comparative embodiment, may be prevented or reduced. In addition, all or most of the excitons supplied from the light emitting device may be used for the non-blue phosphorescent light emitting layer 320 and the blue fluorescent light emitting layer 330 that contact each other, to maximize the efficiency of each light emitting device. Excitons that remain unused for light emission in the light emitting layers 320 and 330 may be reduced or prevented. The lifespan of the light emitting device may be lengthened.

Figure 6:
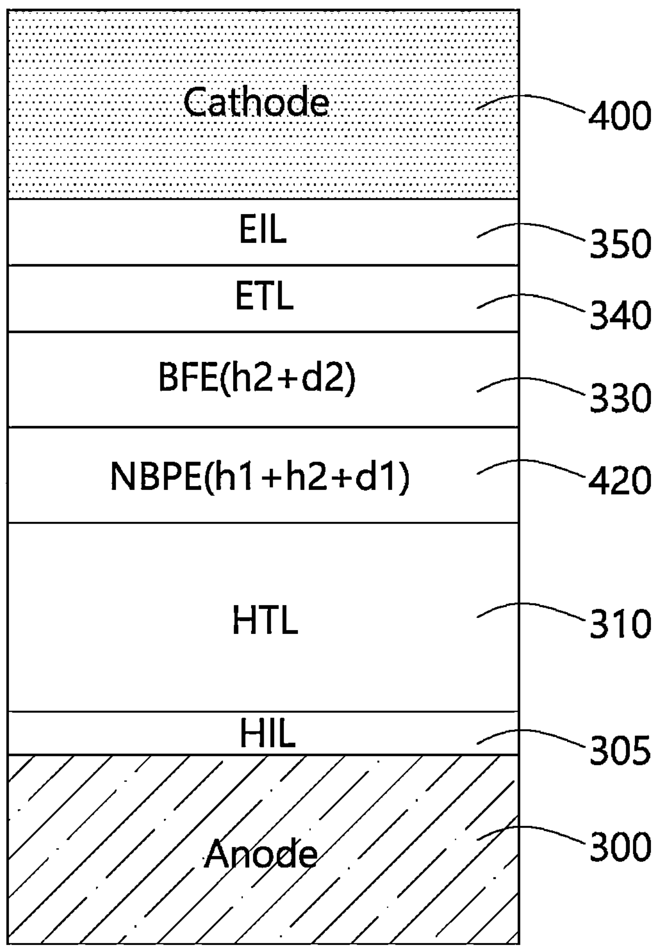
FIG. 6 illustrates a cross-sectional view of a light emitting device according to a second embodiment of the present disclosure.

FIG. 6 illustrates a cross-sectional view of a light emitting device according to a second embodiment of the present disclosure.

As illustrated in FIG. 6, the light emitting device of the second embodiment of the present disclosure has a similar structure to the example embodiment illustrated in FIG. 1. The light emitting device of the second embodiment of the present disclosure includes a non-blue phosphorescent light emitting layer 420 including a first host h1 that may help the excitation action the phosphorescent dopant, and a second host h2 having a high triplet energy level. The light emitting device of the second embodiment of the present disclosure may facilitate Dexter energy transfer from the blue fluorescent light emitting layer 330 to the non-blue phosphorescent light emitting layer 420.

The blue fluorescent light emitting layer 330 includes the second host h2 and the second dopant d2 is described above and in connection with the example embodiments illustrated in FIGS. 1 to 2.

The first electrode 300, the second electrode 400, the first common layer CML1, and the second common layer CML2 in the light emitting device according to the second embodiment are the same as or similar to the first embodiment described above.

Figure 7:
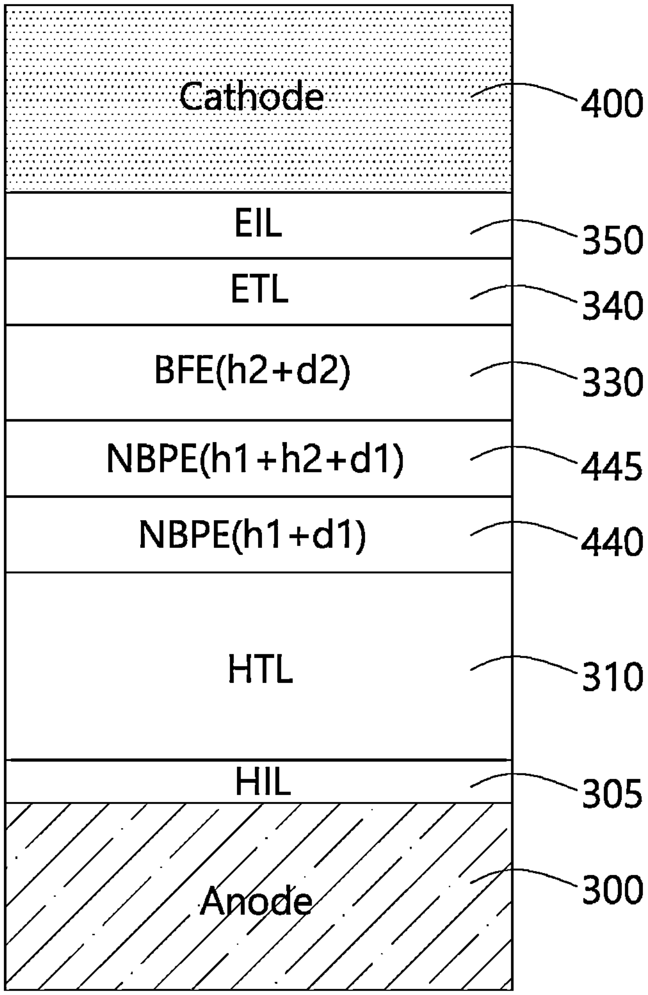
FIG. 7 illustrates a cross-sectional view of a light emitting device according to a third embodiment of the present disclosure.

FIG. 7 illustrates a cross-sectional view of a light emitting device according to a third embodiment of the present disclosure.

As illustrated in FIG. 7, the light emitting device according to the third embodiment of the present disclosure is modified from the second embodiment. the light emitting device according to the third embodiment of the present disclosure has a similar structure as the example embodiment illustrated in FIG. 1. The light emitting layers in the example embodiment of the light emitting device include a first non-blue phosphorescent light emitting layer 440, a second non-blue phosphorescent light emitting layer 445, and a blue fluorescent light emitting layer 330. The first non-blue phosphorescent light emitting layer 440 may have the same configuration as the non-blue phosphorescent light emitting layer including the first host h1 and the first dopant d1 of the example embodiment illustrated in FIG. 2. The second non-blue phosphorescent light emitting layer 445 includes the first host h1 and the second host h2, and the blue fluorescent light emitting layer 330 includes the second host h2 and the second dopant d2 of the example embodiment illustrated in FIG. 2. To change the energy based on the Dexter energy transfer between the first non-blue phosphorescent light emitting layer 440 and the blue fluorescent light emitting layer 330 to the energy based on the first non-blue phosphorescent light emitting layer 440, the second non-blue phosphorescent light emitting layer 445 further includes the second host h2 having a high triplet excitation level.

Both the first and second non-blue phosphorescent light emitting layers 440 and 445 include the first dopant as a light emitting dopant and emit light with the same color.

In both the light emitting devices of the second and third embodiments, the triplets supplied through Dexter energy transfer may be moved smoothly from the blue fluorescent light emitting layer to the non-blue phosphorescent light emitting layer. A phenomenon in which the triplets remain at the triplet excitation level of the blue fluorescent light emitting layer and are lost without being used for light emission may be prevented or the amount of such triplets may be reduced. The efficiency of using excitons for light emission in the non-blue phosphorescent light emitting layer and the adjacent blue fluorescent light emitting layer may be increased or maximized.

In the first and second embodiments of the present disclosure, since the Dexter energy transfer between the first dopant and the first host of the non-blue phosphorescent light emitting layer may be possible when the orbitals physically overlap, the content of dopants in the host is higher than that of the blue fluorescent light emitting layer. In the fluorescent light emitting layer, since energy transfer may be possible by overlap between the absorption energy spectrum of the second host and the emission spectrum of the second dopant, the content of dopant in the fluorescent light emitting layer is smaller than that in the phosphorescent light emitting layer. In each of the non-blue phosphorescent light emitting layers, the content of the first dopant relative to the first host is 20 wt % or less, for example, 10 wt % or less, or 2 wt % to 5 wt %.

In addition, in the blue fluorescent light emitting layer, the content ratio of the second dopant to the second host is 10 wt % or less, for example, 5 wt % or less, or 0.1 wt % to 4 wt %. In any case, the content of dopant in the adjacent non-blue phosphorescent light emitting layer and blue fluorescent light emitting layer is small in that in the blue fluorescent light emitting layer.

Example embodiments of the light emitting device as disclosed in the present disclosure may be a high-efficiency light emitting device that may be capable of converting excitons supplied to the non-blue phosphorescent light emitting layer and the blue fluorescent light emitting layer into light at a ratio of 100%. Example embodiments of the light emitting device may emit multiple colors of light with high efficiency while lowering the driving voltage when applied as a single stack in a white light emitting device. Example embodiments of the light emitting device as disclosed in the present disclosure may serve as a white light emitting device through connection between a stack from the first common layer CML1 to the second common layer CML2, and other stacks between the first and second electrodes 300 and 400.

In addition, in example embodiments of the light emitting device as disclosed in the present disclosure, the efficiency of the non-blue phosphorescent light emitting layer or the efficiency of the blue fluorescent light emitting layer may be increased by adjusting the exciton ratio of the initial state in the light emitting layers adjacent to each other. In addition, the triplets in the blue fluorescent light emitting layer may not remain. Such triplets may be transferred to the phosphorescent light emitting layer through Dexter energy transfer. Extinction in the blue fluorescent light emitting layer may be reduced. The lifespan of the stack capable of emitting blue light may be improved.

In some example embodiments, a host having a high triplet excitation level and a fluorescent dopant are used in a light emitting device having a double light emitting layer structure in which a long-wavelength phosphorescent light emitting layer and a short-wavelength fluorescent light emitting layer are adjacent to each other. An energy level of the singlet excitons of the fluorescent dopant of the fluorescent light emitting layer relaxes to a ground state. Thus, light is emitted. The triplet exciton energy may be transferred to the phosphorescent dopant in the phosphorescent light emitting layer through Dexter energy transfer and may contribute to phosphorescent emission. Accordingly, multi-color light emission may be possible without lowering the efficiency in terms of overall quantum efficiency.

Hereinafter, the light emitting device according to a fourth embodiment of the present disclosure capable of suppressing Dexter energy transfer from a blue fluorescent light emitting layer to a non-blue phosphorescent light emitting layer based on a mechanism different from the first to third embodiments will be described.

Figure 8:
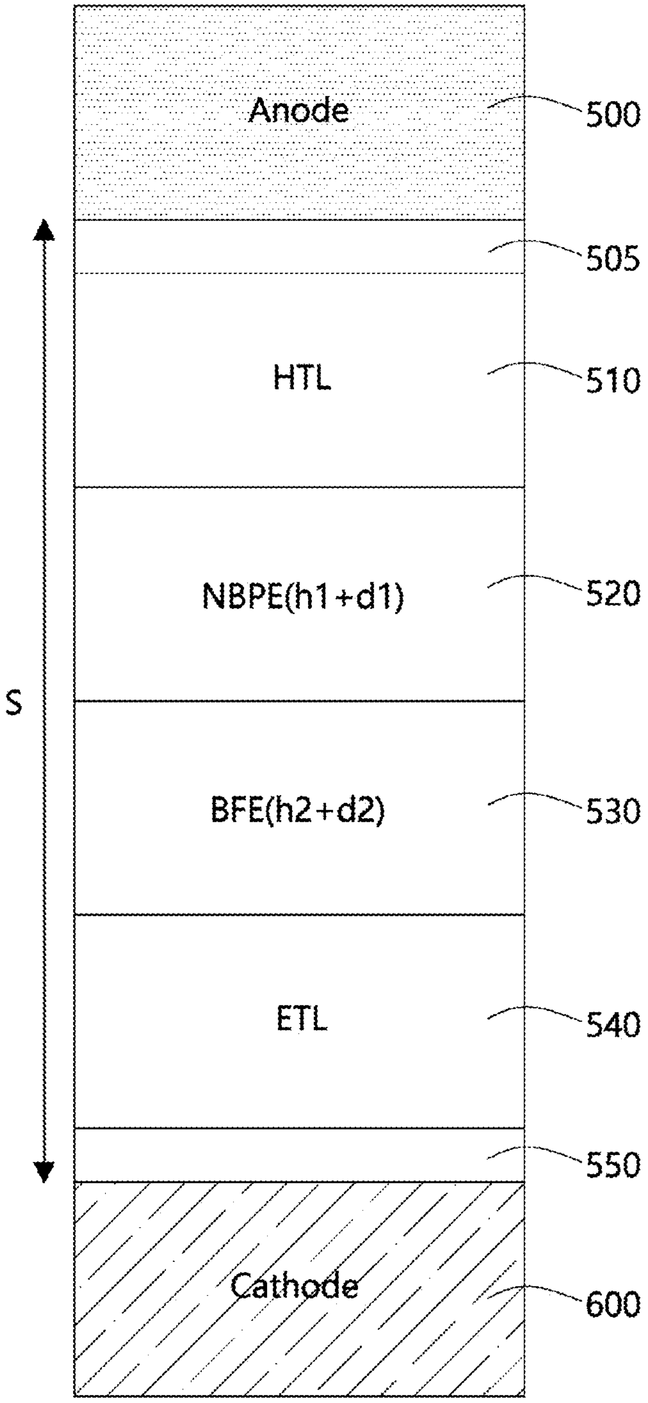
FIG. 8 illustrates a cross-sectional view of a light emitting device according to a fourth embodiment of the present disclosure.
Figure 9:
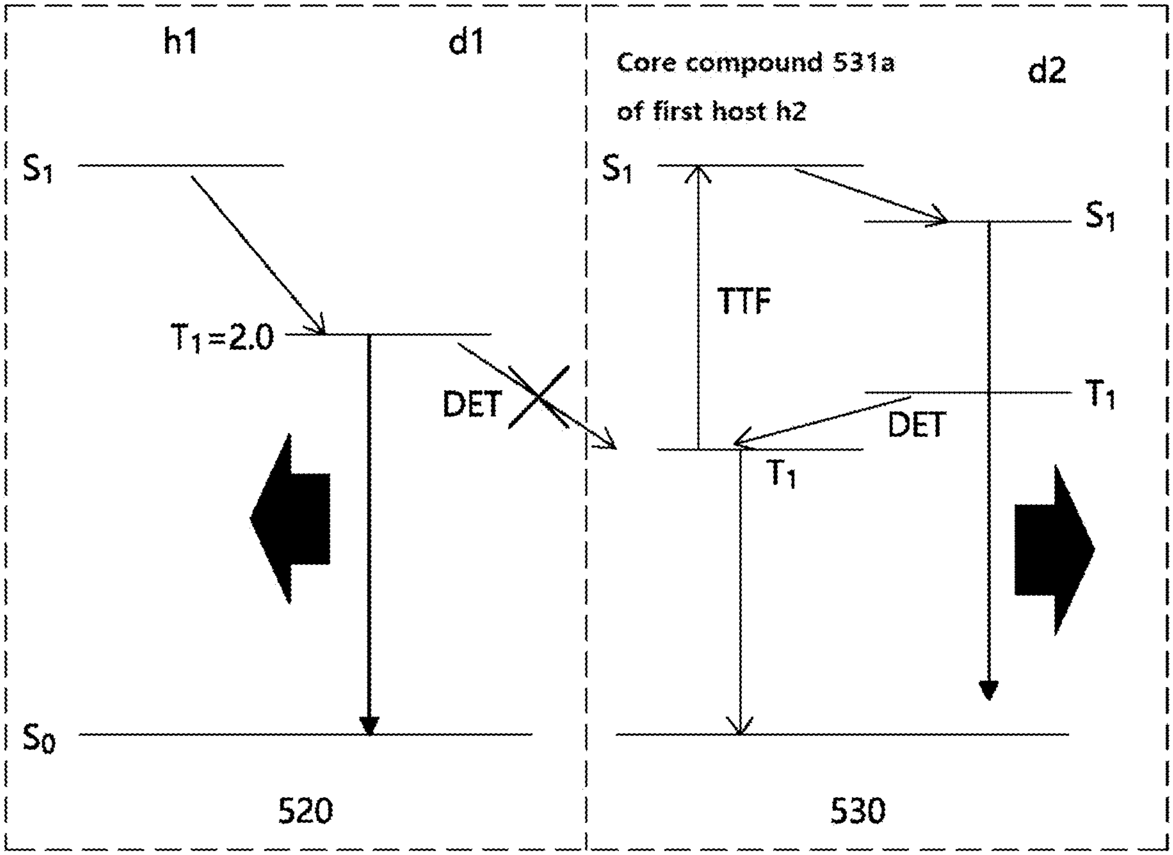
FIG. 9 illustrates energy transfer and light emission mechanism of the non-blue phosphorescent light emitting layer and the blue fluorescent light emitting layer of the example embodiment illustrated in FIG. 8 in the light emitting device according to the fourth embodiment of the present disclosure.
Figure 10:
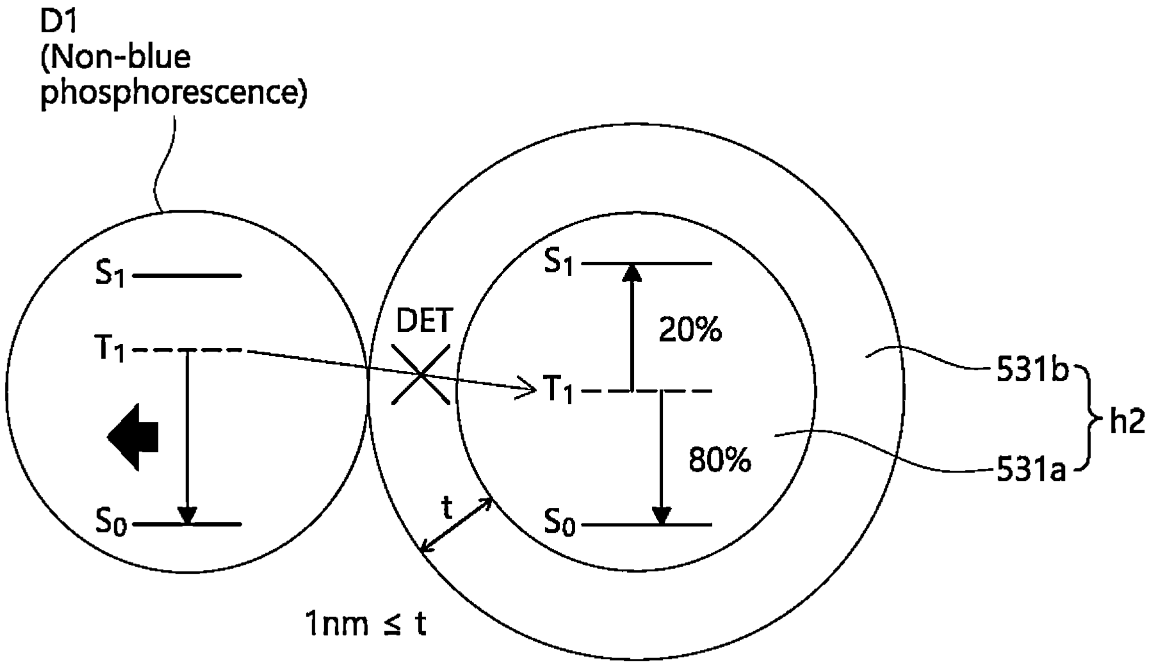
FIG. 10 illustrates a mechanism of suppressing Dexter energy transfer from the first dopant to the second host illustrated in FIG. 9.

FIG. 8 illustrates a cross-sectional view of a light emitting device according to the fourth embodiment of the present disclosure. FIG. 9 illustrates energy transfer and a light emission mechanism of a non-blue phosphorescent light emitting layer and a blue fluorescent light emitting layer of the example embodiment illustrated in FIG. 8 in the light emitting device according to the fourth embodiment of the present disclosure. FIG. 10 illustrates a mechanism of suppressing Dexter energy transfer from the first dopant to the second host illustrated in FIG. 9.

As illustrated in FIG. 8, the light emitting device according to the fourth embodiment of the present disclosure includes a first electrode (e.g., anode) 500 and a second electrode (e.g., cathode) 600 that face each other and are spaced apart from each other. The example embodiment includes a stack S between the first electrode 500 and the second electrode 600. The stack includes a hole injection layer 505, a hole transport layer 510, a non-blue phosphorescent light emitting layer 520, a blue fluorescent light emitting layer 530, an electron transport layer 540, and an electron injection layer 550. In addition to the stack S, the example embodiment of the light emitting device may further include another stack between the electron transport layer 540 and the electron injection layer 550 or between the hole injection layer 505 and the hole transport layer 510. In addition, the another stack may have a light emitting layer structure different from that of the stack S illustrated in FIG. 8. In addition, the another stack may include a plurality of stacks. At least one of the plurality of stacks may be a stack including a blue light emitting layer as a single light emitting layer. The example embodiment of the light emitting device may further include a plurality of stacks and a charge generation layer between the stacks.

In the light emitting device according to the fourth embodiment of the present disclosure, the non-blue phosphorescent light emitting layer 520 includes a first dopant d1 that emits phosphorescent light with a non-blue wavelength and a first host h1 that helps the excitation action of the first dopant d1. The configuration of the non-blue phosphorescent light emitting layer 520 of the light emitting device according to the fourth embodiment of the present disclosure may be the same as or similar to that of the non-blue phosphorescent light emitting layer used in the first to third embodiments and a description thereof will be omitted.

The second host h2 of the blue fluorescent light emitting layer 530 includes a core compound 531*a* and a spacer 531*b* disposed at a distance of 1 nm or more outside the core compound 531*a*.

Although the core compound 531*a* in the second host h2 of the blue fluorescent light emitting layer 530 has a triplet excitation level lower than the triplet excitation level of the first dopant d1 as illustrated in FIG. 9, the second host h2 further includes, as a structure capable of preventing or reducing Dexter energy transfer, the spacer 531*b* outside the core compound 531*a*. Dexter energy transfer from the adjacent non-blue phosphorescent light emitting layer 520 to the host in the blue fluorescent light emitting layer 530 may be prevented or reduced.

Dexter energy transfer caused by the difference between the triplet excitation levels for the triplets may be possible through orbitals that are adjacent or overlap. Dexter energy transfer may be possible when the distance between an element that supplies Dexter energy and an element that receives the Dexter energy is less than 1 nm. Dexter energy transfer may be physically suppressed by adjusting the distance of the spacer 531*b* from the outside (outer surface) of the second host h2 of the present disclosure to 1 nm or more.

The core compound of the second host h2 may be a compound containing anthracene at the center. The spacer 531*b* may be a methyl group, a tertiary-butyl group, a phenyl group, or the like. The spacer 531*b* may be substituted with an end group of the core compound 531*a*.

For example, the core compound of the second host h2 is represented by Formula 13. The second host h2 may comprise any one selected from compounds represented by Formulas 14 to 16.

[Formula 13]

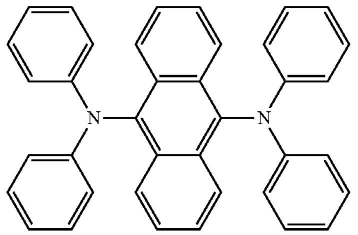

[Formula 14]

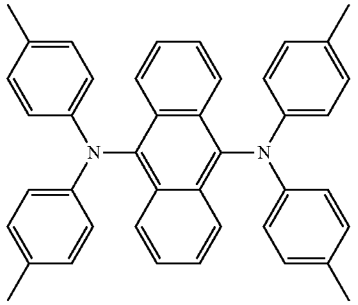

[Formula 15]

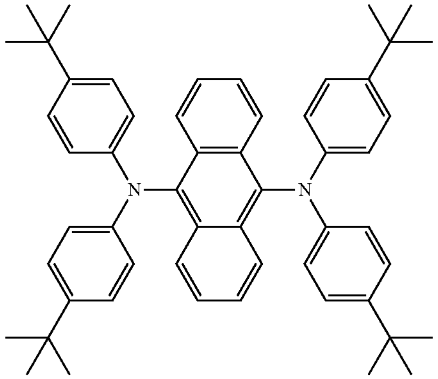

-continued

[Formula 16]

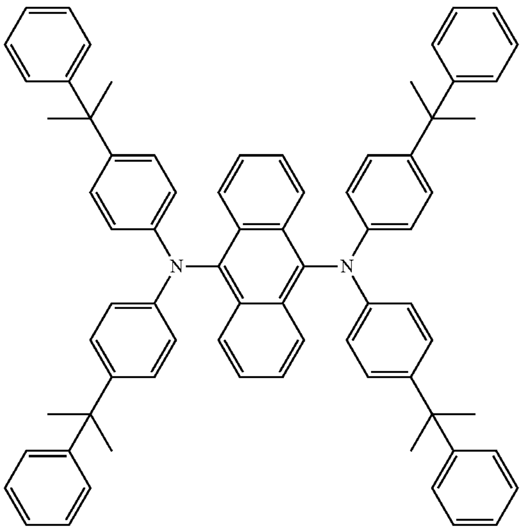

The second dopant of the blue fluorescent light emitting layer 530 is a boron-based dopant. The second dopant has a smaller singlet-triple excitation level difference (ΔEst) and a higher triplet excitation level T1 than the first dopant d1 of the non-blue phosphorescent light emitting layer 520, similar to the second dopant disclosed in the first to third embodiments.

The light emitting device according to fourth embodiment of the present disclosure further includes a spacer 531*b* as a spatial barrier. Dexter energy transfer from the non-blue phosphorescent dopant to the second host in the blue fluorescent light emitting layer due to the triplet level difference may be suppressed. The triplets acting on excitation in the non-blue phosphorescent light emitting layer may be permitted. It may be possible to reduce non-emission loss by the remaining triplets at the triplet excitation level of the second host, and to prevent or reduce quenching by the triplets in the blue fluorescent light emitting layer 530. Accordingly, the light emitting device according to the fourth embodiment of the present disclosure may maximize or increase the efficiency of using excitons for light emission in the adjacent non-blue phosphorescent light emitting layer and the blue fluorescent light emitting layer and improve lifespan.

Figure 11A:
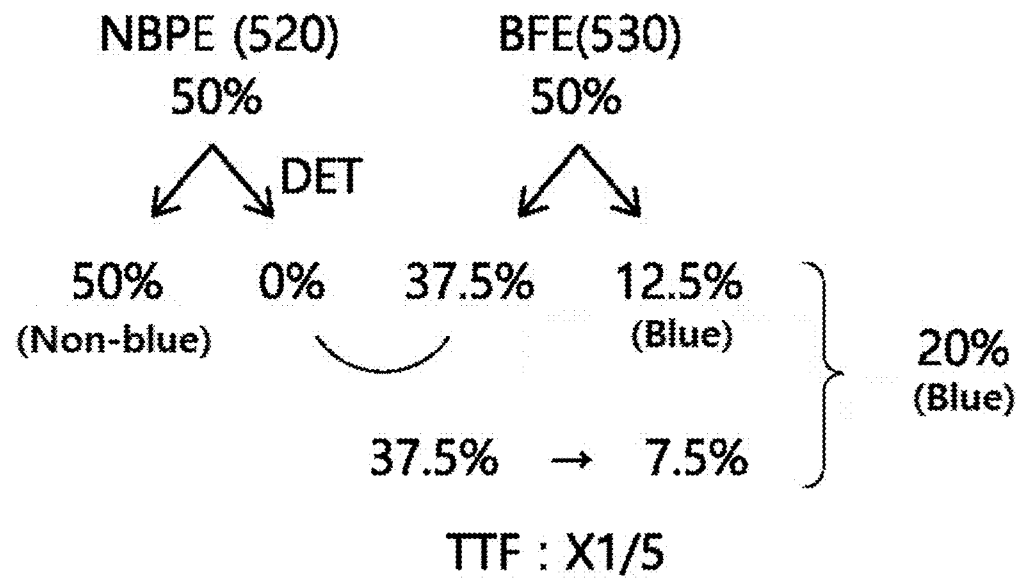
FIGS. 11A to 11C illustrate the internal quantum efficiency of each light emitting layer depending on the exciton ratio of the non-blue phosphorescent light emitting layer to the blue fluorescent light emitting layer in an example embodiment of the light emitting device based on the light-emission mechanism illustrated in FIG. 9.
Figure 11B:
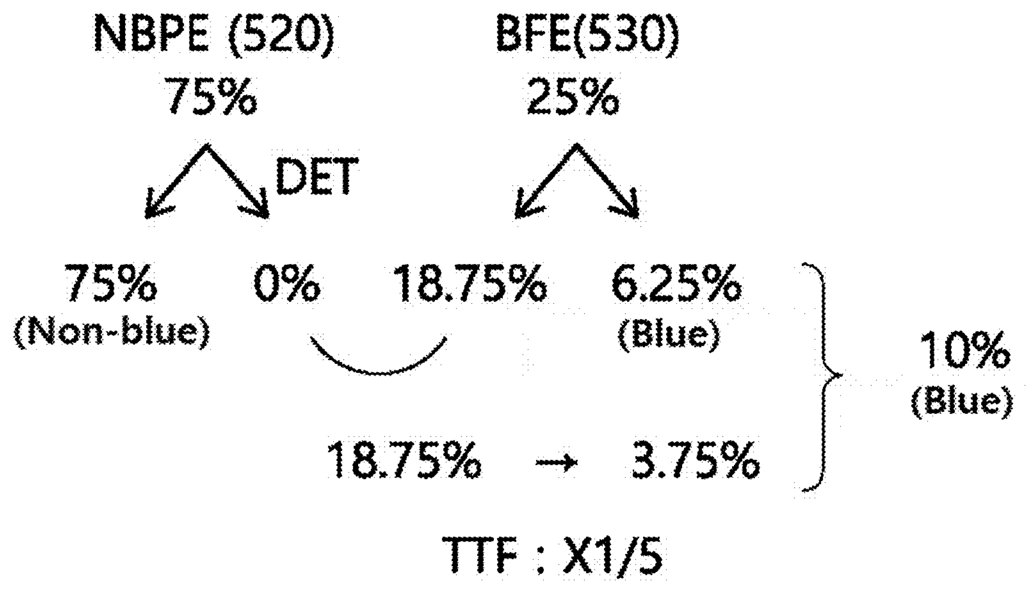
Figure 11C:
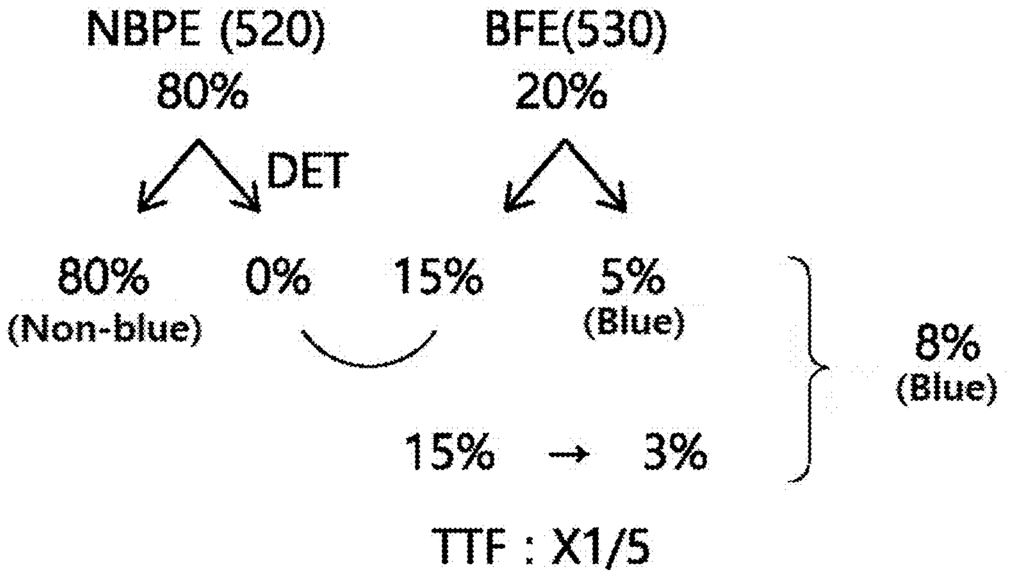

FIGS. 11A to 11C illustrate the internal quantum efficiency of each light emitting layer depending on the exciton ratio of the non-blue phosphorescent light emitting layer to the blue fluorescent light emitting layer in an example embodiment of the light emitting device based on the light-emission mechanism illustrated in FIG. 9.

As illustrated in FIG. 11A, the initial exciton distribution ratio of the non-blue phosphorescent light emitting layer 520 to the blue fluorescent light emitting layer 530 is adjusted to 50%:50%. By controlling the current driving, the thickness ratio of the non-blue phosphorescent light emitting layer 520 to the blue fluorescent light emitting layer 530, and the contents of the first and second dopants d1 and d2, all or most of the excitons inside the non-blue phosphorescent light emitting layer 520 may contribute to phosphorescence emission since Dexter energy transfer to the second host h2 of the adjacent blue fluorescent light emitting layer 530 may be spatially impossible. The non-blue phosphorescent light emitting layer 520 may use all or most of the supplied 50% of excitons for light emission. Thus, the non-blue phosphorescent light emitting layer 520 may have an internal quantum efficiency of 50%.

The blue fluorescent light emitting layer 530 has a triplet to singlet ratio of 3:1. Singlets at the singlet excitation level S1 contribute to blue fluorescence. Dexter energy transfer may occur from the second dopant d2 having a high second triplet excitation level to the second host h2 having a low second triplet excitation level. Triplets at the triplet excitation level of the second host h2 may be transferred to the singlet excitation level through TTF between the triplets, which is transferred to the singlet excitation level of the second dopant d2. Thus, there may be additional fluorescence emission. Roughly, additional fluorescence emission using TTF action may be possible at the exciton ratio of ⅕. Accordingly, the blue fluorescent light emitting layer 530 may have an internal quantum efficiency of 12.5%, as calculated from 50%*¼, due to a singlet ratio of ¼. The blue fluorescent light emitting layer 530 may have an internal quantum efficiency of 20% (50%*¼+37.5%*⅕), which is the sum of 50%*¼ and 37.5%*⅕ based on Dexter energy transfer from the internal second dopant d2 to the second host h2 and additional fluorescence emission by TTF action.

As seen from Table 3, FIG. 11A illustrates that the sum of the internal quantum efficiencies of the non-blue phosphorescent light emitting layer 520 and the blue fluorescent light emitting layer 530 is 70%, which is improved compared to comparative embodiment in which suppression of Dexter energy transfer may be impossible.

FIG. 11B illustrates that the initial exciton distribution ratio of the non-blue phosphorescent light emitting layer 520 to the blue fluorescent light emitting layer 530 is adjusted to 75%:25%, all or most of the excitons inside the non-blue phosphorescent light emitting layer 520 may contribute to the phosphorescence emission since Dexter energy transfer to the second host h2 of the adjacent blue fluorescent light emitting layer 530 is spatially impossible. The non-blue phosphorescent light emitting layer 520 may use all or most of 75% of the supplied excitons for light emission and thus has an internal quantum efficiency of 75%.

In this case, the blue fluorescent light emitting layer 530 has a triplet to singlet ratio of 3:1, singlets at the singlet excitation level S1 contribute to blue fluorescence, Dexter energy transfer occurs from the second dopant d2 having a high second triplet excitation level to the second host h2 having a low second triplet excitation level, and triplets at the triplet excitation level of the second host h2 are transferred to the singlet excitation level through TTF between the triplets, which is transferred to the singlet excitation level of the second dopant d2, thus causing additional fluorescence emission. Roughly, additional fluorescence emission using TTF action may be possible at the exciton ratio of ⅕. Accordingly, the blue fluorescent light emitting layer 530 has an internal quantum efficiency of 6.25% corresponding to 25%*¼ due to a singlet ratio of ¼, and has an internal quantum efficiency of 10% (25%*¼+18.75%*⅕), which is the sum of 25%*¼ and 18.75%*⅕ based on Dexter energy transfer from the second dopant d2 to the second host h2 and additional fluorescence emission by TTF action.

As seen from Table 3, FIG. 11B illustrates that the sum of the internal quantum efficiencies of the non-blue phosphorescent light emitting layer 520 and the blue fluorescent light emitting layer 530 is 85%, which is improved compared to the comparative embodiment in which suppression of Dexter energy transfer may be impossible.

FIG. 11C illustrates that the initial exciton distribution ratio of the non-blue phosphorescent light emitting layer 520 to the blue fluorescent light emitting layer 530 is adjusted to 80%:20%. All or most of the excitons inside the non-blue phosphorescent light emitting layer 520 may contribute to phosphorescence emission since Dexter energy transfer to the second host h2 of the adjacent blue fluorescent light emitting layer 530 may be spatially impossible. The non-blue phosphorescent light emitting layer 520 may use all or most of 80% of the supplied excitons for light emission. Thus, the non-blue phosphorescent light emitting layer 520 may have an internal quantum efficiency of 80%.

The blue fluorescent light emitting layer 530 has a triplet to singlet ratio of 3:1. Singlets at the singlet excitation level S1 contribute to blue fluorescence. Dexter energy transfer may occur from the second dopant d2 having a high second triplet excitation level to the second host h2 having a low second triplet excitation level. Triplets at the triplet excitation level of the second host h2 may be transferred to the singlet excitation level through TTF between the triplets, which is transferred to the singlet excitation level of the second dopant d2. Additional fluorescence emission may result. Roughly, additional fluorescence emission using TTF action may be possible at the exciton ratio of ⅕. Accordingly, the blue fluorescent light emitting layer 530 may have an internal quantum efficiency of 5%, as calculated from 20%*¼ due to a singlet ratio of ¼. The blue fluorescent light emitting layer 530 may have an internal quantum efficiency of 8% (20%*¼+15%*⅕), which is the sum of 20%*¼ and 15%*⅕ based on Dexter energy transfer from the internal second dopant d2 to the second host h2 and additional fluorescence emission by TTF action.

As summarized in Table 3, FIG. 11C illustrates that the sum of the internal quantum efficiencies of the non-blue phosphorescent light emitting layer 520 and the blue fluorescent light emitting layer 530 is 88%, which is improved compared to the comparative embodiment in which suppression of Dexter energy transfer may be impossible.

The example embodiments illustrated in FIGS. 11A to 11C and Table 3 show that the non-blue phosphorescent light emitting layer 520 may be completely used for phosphorescent emission. The internal quantum efficiency may be utilized when the initial exciton distribution ratio of the non-blue phosphorescent light emitting layer 520 is increased. The non-blue phosphorescent light emitting layer 520 may not exhibit exciton reduction due to Dexter energy transfer. Therefore, the light emitting device according to fourth embodiment of the present disclosure may exhibit internal quantum efficiency without exciton reduction of the non-blue phosphorescent light emitting layer.

TABLE 3

| Item | FIG. 11A | FIG. 11B | FIG. 11C |
|---|---|---|---|
| Initial exciton ratio (520:530) | 50%:50% | 75%:25% | 80%:20% |
| Internal quantum efficiency | IQE | IQE | IQE |
| Non-blue phosphorescent light emitting layer (520) | 50% | 75% | 80% |
| Blue fluorescent light emitting layer (530) | 20% | 10% | 8% |
| Total efficiency of light emitting layers | 70% | 85% | 88% |

Hereinafter, an example of a light emitting device having a multi-stack structure will be described.

Figure 12:
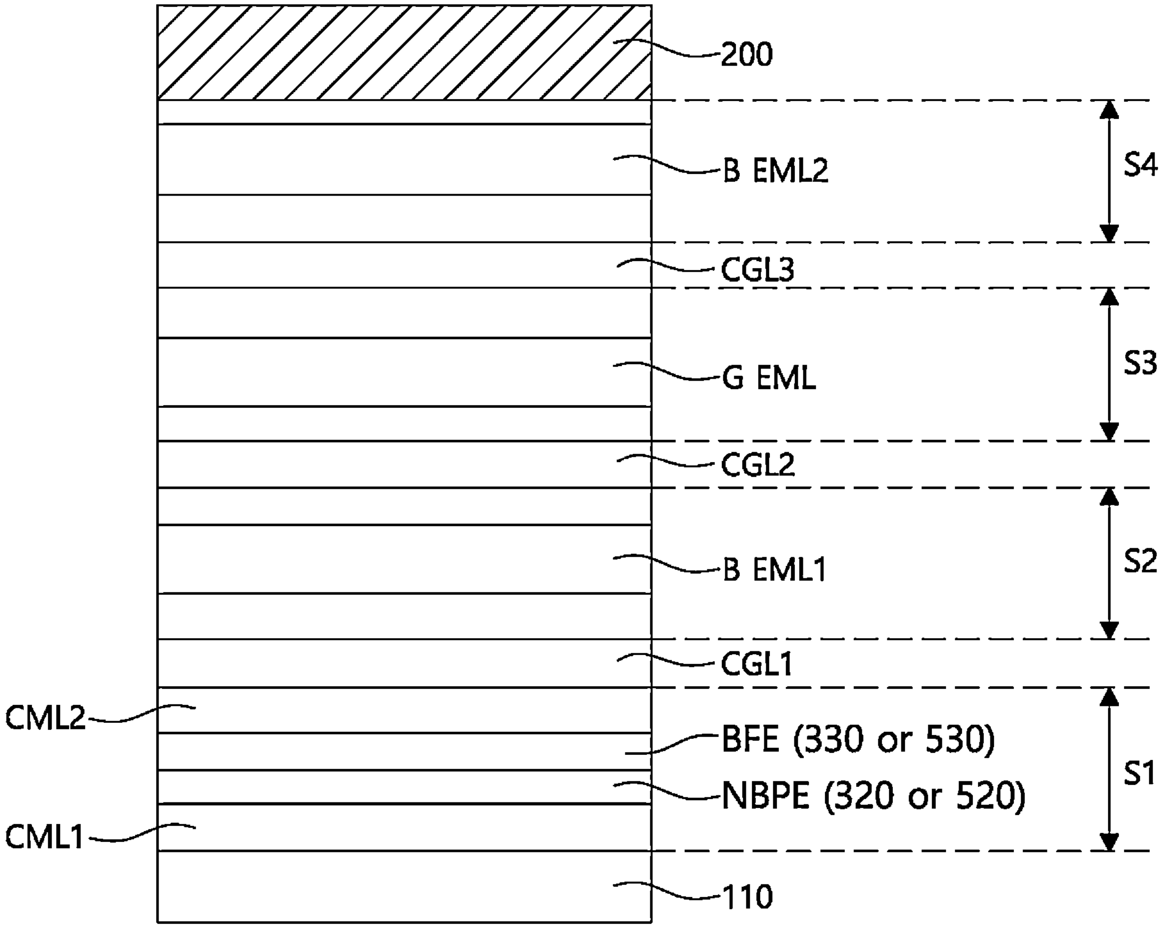
FIG. 12 illustrates a cross-sectional view of a light emitting device according to another embodiment of the present disclosure.
Figure 13:
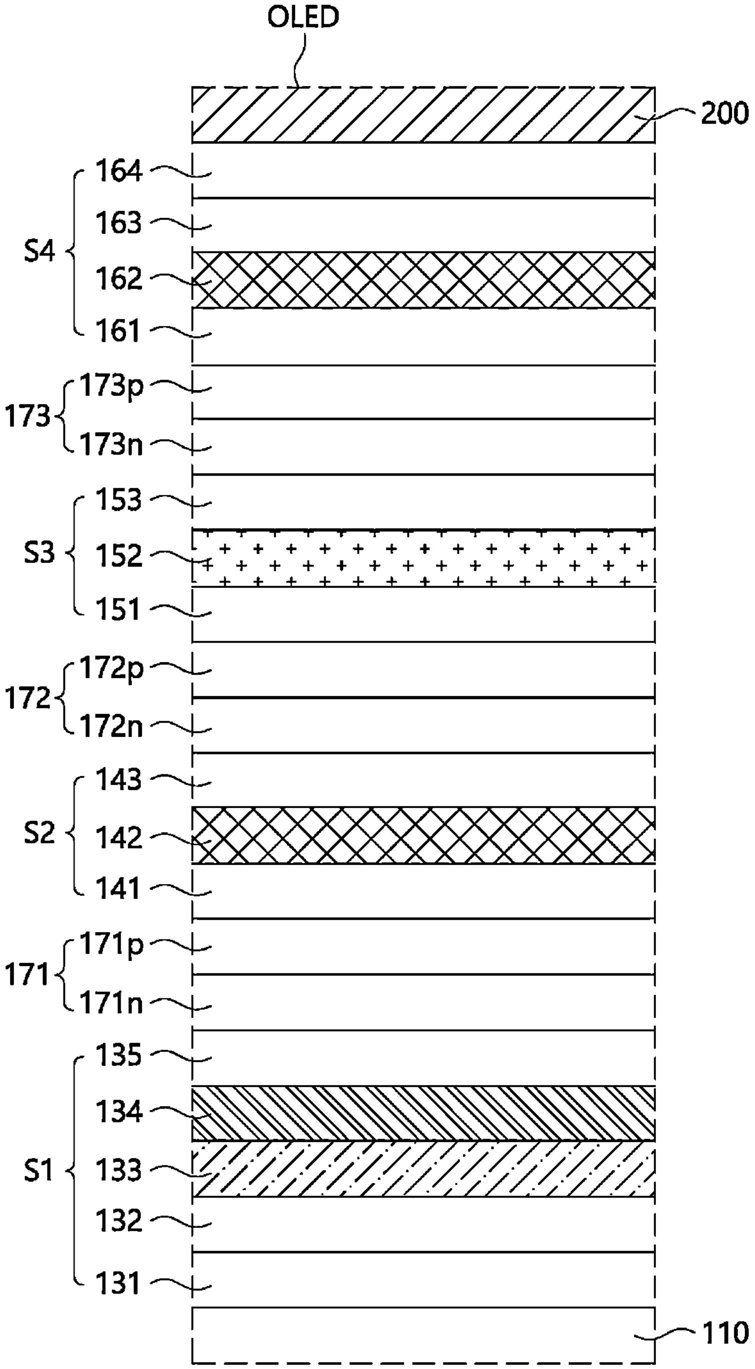
FIG. 13 illustrates a cross-sectional view of the light emitting device according to the example embodiment illustrated in FIG. 12.

FIG. 12 illustrates a cross-sectional view of a light emitting device according to another embodiment of the present disclosure. FIG. 13 illustrates a cross-sectional view of the light emitting device according to the example embodiment illustrated in FIG. 12.

As illustrated in FIG. 12, the light emitting device according to another embodiment of the present disclosure includes first to fourth stacks S1, S2, S3, and S4. The first to fourth stacks S1, S2, S3, and S4 are separated by the charge generation layers CGL1, CGL2, CGL3, and CGL4, which are disposed between the first and second electrodes 110 and 200 facing each other.

One stack, S1, of the first to fourth stacks S1 to S4 may be a stack including a hole transport layer 310, a non-blue phosphorescent light emitting layer 320 or 520, a blue fluorescent light emitting layer 330 or 530, and an electron transport layer 340, as described with reference to the example embodiments illustrated in FIGS. 1 and 8. In an example embodiment, the first stack S1 has a structure in which the non-blue phosphorescent light emitting layer 320 or 520 and the blue fluorescent light emitting layer 330 or 530 come into contact with each other. The configuration of the stack in which the non-blue phosphorescent light emitting layer 320 or 520 and the blue fluorescent light emitting layer 330 or 530 come into contact with each other is not limited to this example embodiment. The configuration disclosed herein may be disposed in one of the second to fourth stacks other than the first stack S1.

The non-blue phosphorescent light emitting layer 320 or 520 may be a red light emitting layer. The non-blue phosphorescent light emitting layer 320 or 520 may have an emission peak at a wavelength of 600 nm to 650 nm. The blue fluorescent light emitting layer 330 or 530 may have an emission peak at a wavelength of 430 nm to 480 nm.

In addition, the remaining stacks S2 to S4 have a configuration different from that of the first stack S1. The remaining stacks S2 to S4 include one or more light emitting layers. One of the remaining stacks may be a green stack including a green light emitting layer. The remaining stacks among S2 to S4 may be a blue stack including a blue light emitting layer. In an example embodiment, the third stack S3 is a green stack, and the second and fourth stacks S2 and S4 are blue stacks. But the present disclosure is not limited thereto. The light emitting stack having a structure in which the blue fluorescent light emitting layer 330 or 530 comes into contact with the blue fluorescent light emitting layer, or the green stack having the green light emitting layer as the light emitting layer may be moved to another position.

The light emitting device according to another embodiment of the present disclosure illustrated in FIG. 12 is a white light emitting device realized by stacking a plurality of layers. The example embodiment of the light emitting device has a configuration including the green stack S3 including, as a light emitting layer, a single green light emitting layer that emits green light with the highest contribution of white. The remaining stacks include a blue light emitting layer to compensate for insufficient efficiency of blue.

FIG. 12 illustrates an example embodiment in which four stacks are disposed between the first and second electrodes 110 and 200. As the light emitting device as disclosed in the present disclosure, any light emitting device may be applied so long as it includes two or more stacks, one stack including a non-blue phosphorescent light emitting layer 320 or 520 and a blue fluorescent light emitting layer 330 or 530 as light emitting layers, and the other stack including a light emitting stack capable of emitting green light. The light emitting device according to another example embodiment of the present disclosure may include, as a basic configuration, a stack including a plurality of light emitting layers including a non-blue phosphorescent light emitting layer and a blue fluorescent light emitting layer that come into contact with each other, and a green stack including a green light emitting layer. The example embodiment may further include one or more blue light emitting stacks to compensate for insufficient efficiency of blue.

A layer not illustrated in FIG. 12 is a common layer of the hole transport layer or the electron transport layer.

As illustrated in FIG. 13, the light emitting device according to another embodiment of the present disclosure includes a first electrode 110 and a second electrode 200 facing each other, and first to fourth stacks S1, S2, S3, and S4 separated by charge generating layers 171, 172, and 173 between the first electrode 110 and the second electrode 200.

The charge generation layers 171, 172, and 173 include the n-type charge generation layers 171*n*, 172*n*, and 173*n* that generate electrons and transport the same to the electron transport layer of an adjacent stack. The charge generation layers 171, 172, and 173 include p-type charge generation layers 171*p*, 172*p*, and 173*p* that generate holes and transport the holes to the hole transport layer of the adjacent stack.

The first stack S1 includes a hole injection layer 131, a first hole transport layer 132, a red phosphorescent light emitting layer 133, a blue fluorescent light emitting layer 134, and a first electron transport layer 135. The first stack S1 emits blue light along with red light. Similar to the light emitting devices according to the first to fourth embodiments, the red phosphorescent light emitting layer 133 and the adjacent blue fluorescent light emitting layer 134 are present in the same stack. Excitons are distributed thereto to emit light. The initial distribution ratio of excitons is adjusted to increase the luminous efficacy of red or the luminous efficacy of blue. The blue fluorescent light emitting layer 134 has the second host h2 having a triplet excitation level between the triplet excitation level of the second dopant d2 in the blue fluorescent light emitting layer 134 and the triplet excitation level of the first dopant d1 in the red phosphorescent light emitting layer 133. Alternatively, the blue fluorescent light emitting layer 134 includes the second host h2 that further includes a spacer capable of preventing or reducing Dexter energy transfer from the red dopant outside the core compound, to suppress Dexter energy transfer from the red phosphorescent light emitting layer 133 to the blue fluorescent light emitting layer 134. Accordingly, the red phosphorescent light emitting layer 133 may use all or most of the initially distributed excitons for light emission. In some embodiments, the efficiency of phosphorescent light emission may be improved based on the triplets added by Dexter energy transfer in the blue fluorescent light emitting layer 134. In addition, the blue fluorescent light emitting layer 134 may not receive additional triplets due to suppression of the Dexter energy transfer from the red phosphorescent light emitting layer 133. Thus, quenching due to the remaining triplets and improving the lifespan may be prevented or reduced.

The red phosphorescent light emitting layer 133 provided in the first stack S1 may have the same or similar characteristics and material composition as the non-blue phosphorescent light emitting layer 320 or 520 of the light emitting device described in connection with the first to fourth embodiments. The blue fluorescent light emitting layer 134 may have the same or similar characteristics and material composition as the blue fluorescent light emitting layer 330 or 530 of the light emitting device described in connection with the first to fourth embodiments.

The first host h1 of the red phosphorescent light emitting layer 133 may be, for example, any one of BeBq2, BeMq2, and BAlq. The first dopant d1 may be, for example, an iridium complex compound.

The second stack S2 includes a second hole transport layer 141, a first blue light emitting layer 142, and a second electron transport layer 143. The second stack S2 emits blue light.

The third stack S3 includes a third hole transport layer 151, a green light emitting layer 152, and a third electron transport layer 153. The third stack S3 emits green light.

The fourth stack S4 includes a fourth hole transport layer 161, a second blue light emitting layer 162, a fourth electron transport layer 163, and an electron injection layer 164. The fourth stack S4 emits blue light.

The second and fourth stacks S2 and S4 emitting blue light may function to supplement the insufficient efficiency of blue, which has lower visibility compared to other colors in the white light emitting device. The first and second blue light emitting layers 142 and 162 provided in the second and fourth stacks S2 and S4 may have a half maximum width of 40 nm or less to enhance pure color characteristics when the light emitting device is used in a display device. Each or part of the first and second blue light emitting layers 142 and 162 may be the same or similar material as the blue fluorescent light emitting layer 134 in the first stack S1. In some embodiments, the material for the first and second blue light emitting layers 142 and 162 may be the same as or similar to that of the second dopant d2 of the blue fluorescent light emitting layer 134. The material for the second host h2 may be different from that of the second host of the blue fluorescent light emitting layer 134 to improve excitation characteristics of the second dopant d2. In some embodiments, at least one of the first and second blue light emitting layers 142 and 162 may include a blue phosphorescent dopant instead of a blue fluorescent dopant. Alternatively, at least one of the first and second blue light emitting layers 142 and 162 may include a combination of a fluorescent dopant with a phosphorescent dopant.

In addition, in the third stack S3, the green light emitting layer 152 may be a green phosphorescent light emitting layer. The light emitting device according to another embodiment of the present disclosure described in connection with FIG. 13 includes a green phosphorescent light emitting layer emitting a single green light as a light emitting layer. Efficiency may be more than doubled, compared to a structure in which excitons are distributed in a configuration in which a plurality of phosphorescent light emitting layers comes into contact with one another. In addition, similar to the first to fourth embodiments of the present disclosure, Dexter energy transfer from the red phosphorescent light emitting layer 133 to the blue fluorescent light emitting layer 134 may be suppressed so that the ratio of quenched excitons may be lowered. The efficiency in the red phosphorescent light emitting layer 133 may be increased. The efficiency may also be improved compared to a stack having a structure in which the red phosphorescent light emitting layer comes into contact with a non-red phosphorescent light emitting layer.

Hereinafter, example embodiments of the light emitting display device using example embodiments of the light emitting device according to the present disclosure will be described.

Example embodiments of the light emitting device may be commonly applied to a plurality of subpixels to emit white light to a light emitting electrode.

Figure 14:
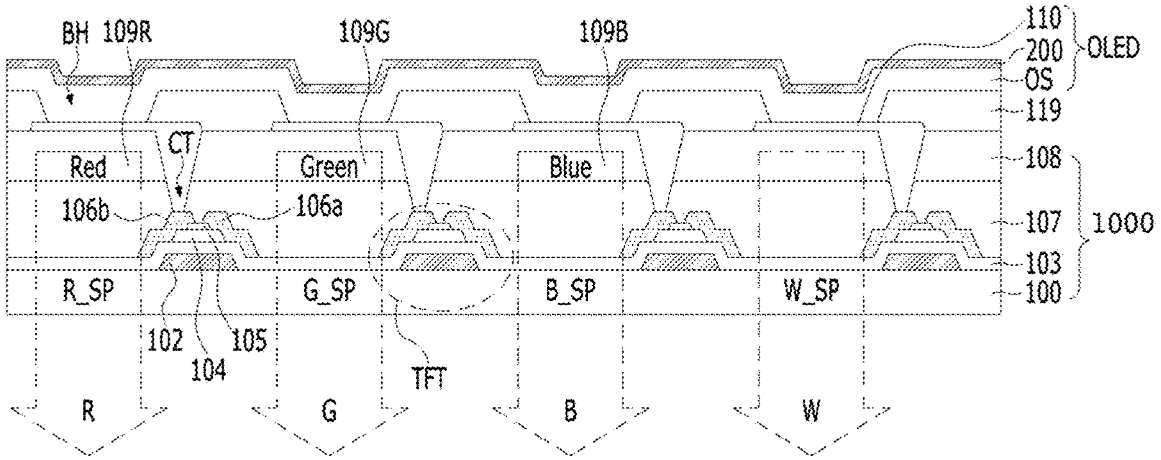
FIG. 14 illustrates a cross-sectional view of a light emitting display device using the example embodiment of the light emitting device illustrated in FIG. 13.

FIG. 14 illustrates a cross-sectional view of a light emitting display device using the example embodiment of the light emitting device illustrated in FIG. 13.

As illustrated in FIG. 14, an example embodiment of the light emitting display device as disclosed in the present disclosure includes a substrate 100 having a plurality of subpixels R_SP, G_SP, B_SP, and W_SP, a light emitting device (also referred to as "OLED, organic light emitting diode") commonly provided on the substrate 100, a thin film transistor (TFT) provided in each of the subpixels and connected to the first electrode 110 of the light emitting device (OLED), and color filters 109R, 109G, or 109B provided below the first electrode 110 of at least one of the subpixels. The OLED includes an internal stack OS.

The example embodiment illustrated in FIG. 14 relates to a configuration including the white subpixel W_SP. But the present disclosure is not limited thereto. A configuration in which the white subpixel W_SP is omitted and only the red, green, and blue subpixels R_SP, G_SP, and B_SP are provided may be also possible. In some embodiments, a combination of a cyan subpixel, a magenta subpixel, and a yellow subpixel capable of creating white by replacing the red, green, and blue subpixels may be possible.

The thin film transistor TFT includes, for example, a gate electrode 102, a semiconductor layer 104, and a source electrode 106*a* and a drain electrode 106*b* connected to respective sides of the semiconductor layer 104. In addition, a channel passivation layer 105 may be further provided on the portion where the channel of the semiconductor layer 104 is located to prevent direct connection between the source/drain electrodes 106*a* and 106*b* and the semiconductor layer 104.

A gate insulating layer 103 is provided between the gate electrode 102 and the semiconductor layer 104.

The semiconductor layer 104 may be formed of, for example, an oxide semiconductor, amorphous silicon, polycrystalline silicon, or a combination thereof. For example, in some embodiments, the semiconductor layer 104 is an oxide semiconductor, the heating temperature for forming the thin film transistor may be lowered. The substrate 100 may be selected from a greater variety of available substrates so that the semiconductor layer 104 may be advantageously applied to a flexible display device.

In addition, the drain electrode 106*b* of the thin film transistor TFT may be connected to the first electrode 110 in a contact hole CT formed in the first and second passivation layers 107 and 108.

In some embodiments, the plurality of subpixels includes a red subpixel, a green subpixel, a blue subpixel, and a white subpixel. The color filter may include first to third color filters, 109R, 109G, and 109B, in the remaining subpixels R_SP, G_SP, B_SP, respectively, excluding the white subpixel W_SP. The white subpixel W_SP allows the emitted white light to pass through the first electrode 110 for each wavelength. A second passivation layer 108 is formed under the first electrode 110 to cover the first to third color filters 109R, 109G, and 109B. The first electrode 110 is formed on the surface of the second passivation layer 108 excluding the contact hole CT.

In the example embodiment illustrated in FIG. 14, the color filter is omitted in the white subpixel W_SP. But the present disclosure is not limited thereto. To reduce the step with the adjacent subpixel even in the white subpixel W_SP, a transparent organic layer may be further provided in a light emitting region.

The light emitting device OLED according to an example embodiment of the present disclosure includes, for example, a transparent first electrode 110, a second electrode 200 that faces the first electrode 110, and a non-blue phosphorescent light emitting layer and a blue fluorescent light emitting layer that come into contact with each other between the hole transport layer and the electron transport layer in any one of the stacks S1, S2, S3, and S4 separated by the charge generation layers CGL1, CGL2, CGL3, and CGL4 between the first and second electrodes 110 and 200, as illustrated in the example embodiment of FIG. 13.

The first electrode 110 is divided for each subpixel. The remaining layers of the white-light emitting device OLED are integrally provided in the entire display area, rather than being divided into individual subpixels.

An element represented by reference numeral "119", as illustrated in the example embodiment of FIG. 14, represents a bank. An element represented by "BH" between two banks refers to a bank hole. Light emission occurs in an open area formed through the bank hole. The bank hole may define an emission zone of each subpixel.

A configuration below the first electrode 110 extending from the substrate 100 to the thin film transistor TFT, color filters 109R, 109G, and 109B, and insulating layers in which these elements are disposed is referred to as a "thin film transistor array substrate" 1000.

Figure 15:
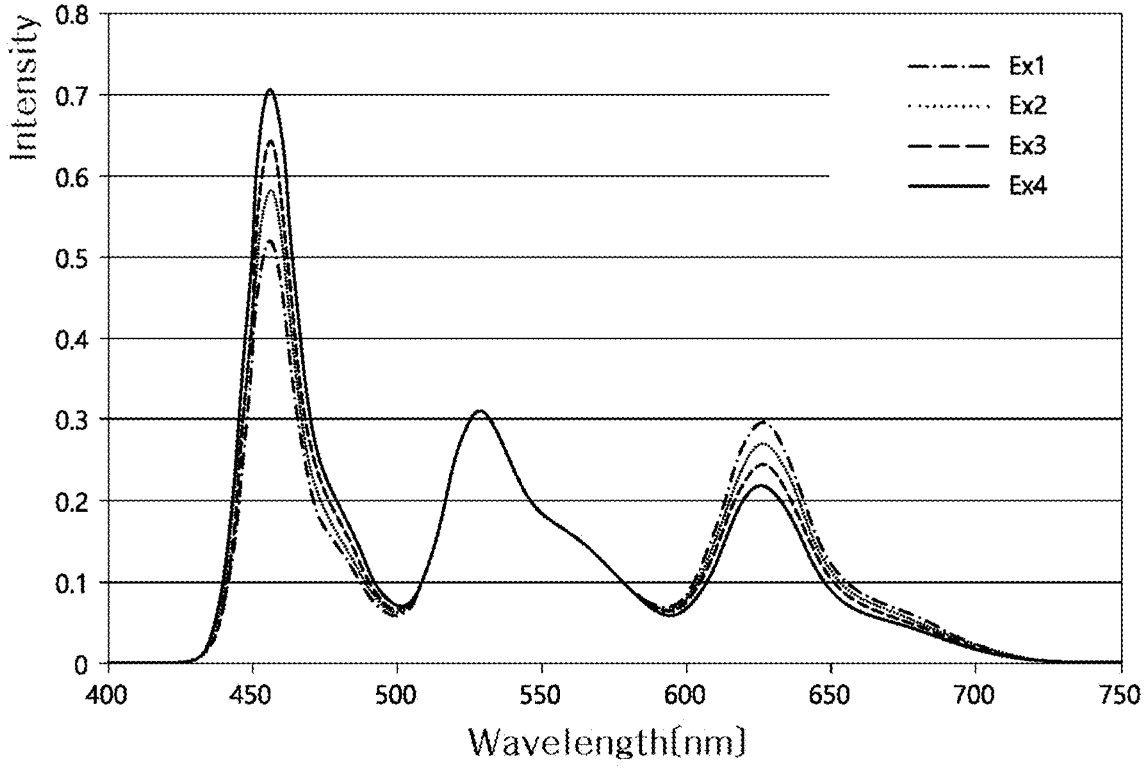
FIG. 15 is a graph showing white spectra of light emitting devices according to first to fourth experimental embodiments.

FIG. 15 is a graph showing white spectra of light emitting devices according to first to fourth experimental embodiments (Ex1 to Ex4).

TABLE 4

| Item | EQE(%) Blue | EQE(%) Green | EQE(%) Red | Color temperature (K) | Full white [nit] R_SP | Full white [nit] G_SP | Full white [nit] B_SP | Full white [nit] W_SP | BT2020 Overlap (%) |
|---|---|---|---|---|---|---|---|---|---|
| Ex1 | 16.6 | 22.2 | 22.6 | 5632 | 510.1 | 388.6 | 282.2 | 195.5 | 85.7 |
| Ex2 | 18.6 | 22.2 | 20.6 | 6402 | 465.9 | 387.9 | 316.8 | 240.1 | 86.1 |
| Ex3 | 20.6 | 22.2 | 18.6 | 7381 | 421.9 | 387.5 | 351.5 | 259.5 | 86.3 |
| Ex4 | 22.6 | 22.2 | 16.6 | 8669 | 378.0 | 387.5 | 386.4 | 270.4 | 86.4 |

The first passivation layer 107 is provided to protect the thin film transistor TFT. Color filters 109R, 109G, and 109B may be provided on the first passivation layer 107.

A light emitting device for realizing white may be required. Each of the subpixels transmits light of a corresponding wavelength based on the transmittance of a wavelength selected by the color filters 109R, 109G, and 109B to realize various colors.

The external quantum efficiency (EQE) listed in Table 4 is a value measured before application of the color filter. In the first experimental embodiment (Ex1), as illustrated in FIG. 15 and Table 1, the external quantum efficiency (EQE) of blue light emitted through an example embodiment of the light emitting device illustrated in FIG. 13 was 16.6%, the external quantum efficiency of green light emitted therethrough was 22.2%, and the external quantum efficiency of red light emitted therethrough was 22.6%. In the example embodiment of the light emitting device illustrated in FIG. 13, in addition to the blue fluorescent light emitting layer 134 that comes into contact with the red phosphorescent light emitting layer 133 of the first stack, the second and fourth blue light emitting stacks also have first and second blue light emitting layers 142 and 162 to supplement the external quantum efficiency of blue light when a single blue light emitting layer is used.

As compared to the first experimental embodiment (Ex1), in each of the second experimental embodiment (Ex2) to the fourth experimental embodiment (Ex4), the external quantum efficiency of blue light emitted through the light emitting device was increased by 2 percentage points, 4 percentage points, and 6 percentage points, respectively. The external quantum efficiency of red light emitted through the light emitting device was decreased by 2 percentage points, 4 percentage points, and 6 percentage points for the second experimental embodiment (Ex2) to the fourth experimental embodiment (Ex4), respectively. The conversion of the luminous efficacy between the red phosphorescent light emitting layer and the blue fluorescent light emitting layer may be possible by controlling the initial exciton ratio of the red phosphorescent light emitting layer to the adjacent blue fluorescent light emitting layer, as illustrated in FIGS. 3A to 3C or FIGS. 11A to 11C.

In addition, the luminance when full-white was applied in each of the first to fourth experimental embodiments (Ex1 to Ex4) refers to the luminance displayed in the red, green, blue, and white sub-pixels when an example of the light emitting device illustrated in FIG. 13 is applied to an example embodiment of the light emitting display device illustrated in FIG. 14.

In the first experimental embodiment (Ex1), the luminance of white when full-white was applied was 195.5 nits. In the first experimental embodiment (Ex1), the color temperature was 5632K, and the overlap ratio with the BT2020 reference value representing the color gamut was 85.7%.

As shown in Table 4 and FIG. 15, in the second experimental embodiment Ex2, when the blue external quantum efficiency was increased by 2 percentage points and the red external quantum efficiency was decreased by 2 percentage points, as compared to the first experimental embodiment Ex1, the luminance of the white subpixel was 240.1 nit, the color temperature was 6402K, and the efficiency of white was improved. In addition, the overlap ratio with the BT2020 reference value of the second experimental embodiment (Ex2) was 86.1%, which was improved compared to the first experimental embodiment (Ex1).

As shown in Table 4 and FIG. 15, in the third experimental embodiment (Ex3), when the external quantum efficiency of blue was increased by 4 percentage points and the external quantum efficiency of red was decreased by 4 percentage points, as compared to the first experimental embodiment (Ex1), the luminance of the white subpixel was 259.5 nit, the color temperature was 7381K, and the efficiency of white was improved. In addition, the overlap ratio with the BT2020 reference value of the third experimental embodiment (Ex3) was 86.3%, which was improved compared to the second experimental embodiment (Ex2).

As shown in Table 4 and FIG. 15, in the fourth experimental embodiment (Ex4), when the external quantum efficiency of blue was increased by 6 percentage points and the external quantum efficiency of red was decreased by 6%, as compared to the first experimental embodiment (Ex1), the luminance of the white subpixel was 270.4 nit, the color temperature was 8660K, and the efficiency of white was improved. In addition, the overlap ratio with the BT2020 reference value of the fourth experimental embodiment (Ex4) was 86.3%, which was improved compared to the third experimental embodiment (Ex3).

The results of the experiment in Table 4 and FIG. 15 show, when the external quantum efficiency was converted to the blue fluorescent light emitting layer depending on the initial ratio of excitons in the structure in which the red phosphorescent light emitting layer and the blue fluorescent light emitting layer come into contact with each other, the efficiency of white improved, the high color temperature was obtained, and the high color gamut standard means that high-definition display may be possible due to the increased overlap ratio with BT2020. In the fourth experimental embodiment (Ex4), when full white was applied, the luminance balance between the red sub-pixel, the green sub-pixel, and the blue sub-pixel was improved, so the difference in driving voltage for each subpixel may be reduced. In addition, the luminance was increased under the same driving voltage conditions as in the first to third experimental embodiments (Ex1 to Ex3). In addition, in the display device using the light emitting device according to the fourth experimental embodiment (Ex4) in which the blue efficiency was improved, each subpixel had a similar temporal change during driving, thereby reducing the variation in deterioration for each region, expressing a high color temperature, improving image quality and satisfying high standards of color gamut.

Accordingly, example embodiments of the light emitting device and the light emitting display device including the same according to the present disclosure prevent or reduce triplet concentration due to Dexter energy transfer from the multi-layered light emitting layer structure, in which the blue fluorescent light emitting layer contacts the non-blue phosphorescent light emitting layer, to the blue fluorescent light emitting layer. The excitons may be used with maximum or increased efficiency for light-emission and without being lost in the adjacent light emitting layer.

In addition, it may be possible to improve the efficiency of blue using a structure in which a blue light emitting stack is combined with a green light emitting stack, in addition to a stack having a blue fluorescent light emitting layer and a non-blue phosphorescent light emitting layer. By controlling the initial exciton ratio between the blue fluorescent light emitting layer and a non-blue phosphorescent light emitting layer, it may be possible to increase the color temperature when realizing white. The balance of each sub-pixel when realizing full white may be maintained. The driving voltage deviation may be reduced. A similar lifespan over time may be maintained.

Example embodiments of the light emitting device and the light emitting display device including the same according to the present disclosure have the following effects.

Example embodiments of the light emitting device according to the present disclosure has a spacer structure that suppresses Dexter energy transfer from the host of the blue fluorescent light emitting layer to the phosphorescent light emitting layer adjacent thereto in a structure in which light emitting layers, a blue fluorescent light emitting layer and at least one phosphorescent light emitting layer come into contact each other. Alternatively, the structure includes a host based on a material having a high triplet excitation level, for example, a material having a triplet excitation level higher than the triplet excitation level of a dopant of the adjacent phosphorescent light emitting layer and lower than the triplet excitation level of a dopant of a blue fluorescent light emitting layer. The quenching of excitons may be reduced and excitons supplied to the blue fluorescent light emitting layer and the adjacent phosphorescent light emitting layer may be used for light emission with the maximum or increased efficiency.

Accordingly, according to the example embodiments of light emitting device as disclosed in the present disclosure, the luminous efficacy of the stack having the blue fluorescent light emitting layer and the adjacent phosphorescent light emitting layer may be improved. The initial excitons may be distributed more in the blue fluorescent light emitting layer in consideration of the improved luminous efficacy of the phosphorescent light emitting layer, so phosphorescence efficiency may be converted into fluorescent blue efficiency. The color temperature of white light emitted when realizing white may be controlled, or the efficiency of a desired color, for example, blue may be improved.

Excitons generated through the present disclosure may be converted into light at a rate close to 100%, which may help to realize a high-efficiency white light emitting device. According to the present disclosure, the excess phosphorescence efficiency is converted into the fluorescent blue efficiency so that the white light emitting device may emit light of a desired color temperature. The red, green, and blue efficiencies may be controlled at a desired ratio. In addition, the use of the blue fluorescent light emitting layer causes an advantage in terms of lifespan.

Example embodiments of the present disclosure can also be described as follows:

A light emitting device according to an embodiment of the present disclosure may include a first electrode and a second electrode facing each other and spaced apart from each other, a blue fluorescent light emitting layer and a non-blue phosphorescent light emitting layer in contact with each other between the first electrode and the second electrode, a first common layer between the first electrode and the non-blue phosphorescent light emitting layer and a second common layer between the blue fluorescent light emitting layer and the second electrode. The non-blue phosphorescent light emitting layer may include a first host, and a first dopant having a first triplet excitation level (T1) and a first singlet-triplet excitation level difference (ΔEst). And the blue fluorescent light emitting layer may include a second dopant having: a second singlet-triplet excitation level difference that is smaller than the first singlet-triplet excitation level difference, and a second triplet excitation level that is higher than the first triplet excitation level, and a second singlet excitation level (S1), and a second host to transfer energy to the second singlet excitation level to suppress Dexter energy transfer from the first dopant.

In a light emitting device according to an embodiment of the present disclosure, the second host may have a third triplet excitation level between the first triplet excitation level and the second triplet excitation level.

In a light emitting device according to an embodiment of the present disclosure, the triplet excitation level is 2.1 eV to 2.4 eV.

In a light emitting device according to an embodiment of the present disclosure, the second host may have a third singlet excitation level that is higher than the second singlet excitation level. The light emitting device may be configured to allow Dexter energy transfer to occur from the third triplet excitation level to the first triplet excitation level.

In a light emitting device according to an embodiment of the present disclosure, the second host may comprise a core compound and a spacer disposed at a distance of 1 nm or more from an outer surface of the core compound.

In a light emitting device according to an embodiment of the present disclosure, the spacer may comprise a methyl group, a tertiary-butyl group, or a phenyl group. The core compound has an end that is bonded to the spacer.

In a light emitting device according to an embodiment of the present disclosure, the core compound may have a fourth triplet excitation level that is lower than the first triplet excitation level.

In a light emitting device according to an embodiment of the present disclosure, the second host may include a core compound having an end that is bonded to a spacer that may include a methyl group, a tertiary-butyl group, or a phenyl group.

In a light emitting device according to an embodiment of the present disclosure, the non-blue phosphorescent light emitting layer may have an emission peak at a wavelength of 600 nm to 650 nm. And the blue fluorescent light emitting layer may have an emission peak at a wavelength of 430 nm to 480 nm.

In a light emitting device according to an embodiment of the present disclosure, the first common layer, the non-blue phosphorescent light emitting layer, the blue fluorescent light emitting layer, and the second common layer may be present in a first stack. The light emitting device may further include second to fourth stacks between the second electrode and the first stack, and a charge generation layer between adjacent stacks among the first to fourth stacks. One of the second to fourth stacks may include a single green phosphorescent light emitting layer as a light emitting layer and at least one of remaining stacks among the second to fourth stacks may include a single blue fluorescent light emitting layer as a light emitting layer.

In a light emitting device according to an embodiment of the present disclosure, the non-blue phosphorescent light emitting layer may further include the second host.

In a light emitting device according to an embodiment of the present disclosure, the non-blue phosphorescent light emitting layer may include a first layer having one surface in contact with the blue fluorescent light emitting layer, the first layer comprising the first host, the second host, and the first dopant, and a second layer in contact with the other surface of the first layer not in contact with the blue fluorescent light emitting layer. The second layer may include the first host and the first dopant.

A light emitting device according to another embodiment of the present disclosure may include a first electrode and a second electrode facing each other and spaced apart from each other, a plurality of stacks between the first electrode and the second electrode and a charge generation layer between the plurality of stacks. One of the plurality of stacks may include a blue fluorescent light emitting layer and a non-blue phosphorescent light emitting layer in contact with each other, and at least one of remaining stacks include a single light emitting layer. The non-blue phosphorescent light emitting layer may include a first host, and a first dopant having a first triplet excitation level (T1) and a first singlet-triplet excitation level difference (ΔEst). The blue fluorescent light emitting layer may include a second dopant having: a second singlet-triplet excitation level difference that is smaller than the first singlet-triplet excitation level difference and a second triplet excitation level that is higher than the first triplet excitation level, and a second host having a third triplet excitation level between the first triplet excitation level and the second triplet excitation level.

In a light emitting device according to an embodiment of the present disclosure, the second host may include at least one of a carbazole-based compound, a fluorene-based compound, a dibenzofuran-based compound, a triazine-based compound, and a quinazoline-based compound.

A light emitting device according to yet another embodiment of the present disclosure may include a first electrode and a second electrode facing each other and spaced apart from each other, a plurality of stacks between the first electrode and the second electrode and a charge generation layer between the plurality of stacks. The plurality of stacks may include a first stack including a blue fluorescent light emitting layer and a non-blue phosphorescent light emitting layer in contact with each other, and at least one of remaining stacks may include a single light emitting layer. The non-blue phosphorescent light emitting layer may include a first host and a first dopant having a first triplet excitation level (T1) and a first singlet-triplet excitation level difference (ΔEst). The blue fluorescent light emitting layer may include a second dopant having: a second singlet-triplet excitation level difference that is smaller than the first singlet-triplet excitation level difference and a second triplet excitation level that is higher than the first triplet excitation level, and a second host including a core compound and a spacer disposed at a distance of 1 nm or more from an outer surface of the core compound.

The spacer may include a methyl group, a tertiary-butyl group, or a phenyl group. The core compound may include an end that is bonded to the spacer.

In a light emitting device according to an embodiment of the present disclosure, the non-blue phosphorescent light emitting layer may have an emission peak at a wavelength of 600 nm to 650 nm. The blue fluorescent light emitting layer may have an emission peak at a wavelength of 430 nm to 480 nm.

In a light emitting device according to an embodiment of the present disclosure, the plurality of stacks may include four or more stacks The first stack may contact at least one of the first electrode and the second electrode.

In a light emitting device according to an embodiment of the present disclosure, the plurality of stacks may include four or more stacks. At least one of the remaining stacks may include at least one blue stack including a blue light emitting layer and a phosphorescent stack including a phosphorescent light emitting layer emitting light of a different color from the non-blue phosphorescent light emitting layer.

A light emitting display device according to yet another embodiment of the present disclosure may include a substrate including a plurality of subpixels, a driving circuit including at least one thin film transistor at each of the plurality of subpixels, and a light emitting device connected to the driving circuit at each of the plurality of subpixels. The light emitting device may include: a first electrode and a second electrode facing each other and spaced apart from each other, a blue fluorescent light emitting layer and a non-blue phosphorescent light emitting layer in contact with each other between the first electrode and the second electrode. The non-blue phosphorescent light emitting layer may include: a first host, and a first dopant having a first triplet excitation level (T1) and a first singlet-triplet excitation level difference (ΔEst). The blue fluorescent light emitting layer may include: a second dopant having: a second singlet-triplet excitation level difference that is smaller than the first singlet-triplet excitation level difference, a second triplet excitation level that is higher than the first triplet excitation level, and a second singlet excitation level (S1), and a second host to transfer energy to the second singlet excitation level and to suppress Dexter energy transfer from the first dopant.

A light emitting display device according to an embodiment of the present disclosure may further include a color filter between the substrate and the light emitting device at at least one of the plurality of subpixels.

It will be apparent to those skilled in the art that various modifications and variations may be made within the scope of the present disclosure without departing from the spirit or scope of the disclosure. Thus, it is intended that the present disclosure covers such modifications and variations thereto, provided they fall within the scope of the appended claims and their equivalents.

What is claimed is:

1. A light emitting device comprising:

a first electrode and a second electrode facing each other and spaced apart from each other;

a blue fluorescent light emitting layer and a non-blue phosphorescent light emitting layer in contact with each other between the first electrode and the second electrode;

a first common layer between the first electrode and the non-blue phosphorescent light emitting layer; and a second common layer between the blue fluorescent light emitting layer and the second electrode, wherein:

the non-blue phosphorescent light emitting layer comprises:

a first host, and a first dopant having a first triplet excitation level, a first singlet excitation level and a first singlet-triplet excitation level difference between the first triplet excitation level and the first singlet excitation level, and the blue fluorescent light emitting layer comprises:

a second dopant having:

a second triplet excitation level that is higher than the first triplet excitation level;

a second singlet excitation level; and a second singlet-triplet excitation level difference between the second triplet excitation level and the second singlet excitation level, the second singlet-triplet excitation level being smaller than the first singlet-triplet excitation level difference; and a second host to transfer energy to the second singlet excitation level and to suppress Dexter energy transfer from the first dopant.

2. The light emitting device according to claim 1, wherein the second host has a third triplet excitation level between the first triplet excitation level and the second triplet excitation level.

3. The light emitting device according to claim 2, wherein the third triplet excitation level is 2.1 eV to 2.4 eV.

4. The light emitting device according to claim 2, wherein:

the second host has a third singlet excitation level that is higher than the second singlet excitation level, and the light emitting device is configured to allow Dexter energy transfer to occur from the third triplet excitation level to the first triplet excitation level.

5. The light emitting device according to claim 1, wherein the second host comprises a core compound and a spacer disposed at a distance of 1 nm or more from an outer surface of the core compound.

6. The light emitting device according to claim 5, wherein the spacer comprises a methyl group, a tertiary-butyl group, or a phenyl group, and the core compound has an end that is bonded to the spacer.

7. The light emitting device according to claim 6, wherein the core compound has a fourth triplet excitation level that is lower than the first triplet excitation level.

8. The light emitting device according to claim 1, wherein the second host comprises a core compound having an end that is bonded to a spacer that comprises a methyl group, a tertiary-butyl group, or a phenyl group.

9. The light emitting device according to claim 1, wherein the non-blue phosphorescent light emitting layer has an emission peak at a wavelength of 600 nm to 650 nm, and
- the blue fluorescent light emitting layer has an emission peak at a wavelength of 430 nm to 480 nm.

10. The light emitting device according to claim 9, wherein the first common layer, the non-blue phosphorescent light emitting layer, the blue fluorescent light emitting layer, and the second common layer are present in a first stack, and
- the light emitting device further comprises:
- second to fourth stacks between the second electrode and the first stack; and
- a charge generation layer between adjacent stacks among the first to fourth stacks,
- wherein one of the second to fourth stacks comprises a single green phosphorescent light emitting layer as a light emitting layer and at least one of remaining stacks among the second to fourth stacks comprises a single blue fluorescent light emitting layer as a light emitting layer.

11. The light emitting device according to claim 1, wherein the non-blue phosphorescent light emitting layer further comprises the second host.

12. The light emitting device according to claim 1, wherein the non-blue phosphorescent light emitting layer comprises:
- a first layer having one surface in contact with the blue fluorescent light emitting layer, the first layer comprising the first host, the second host, and the first dopant; and
- a second layer in contact with the other surface of the first layer not in contact with the blue fluorescent light emitting layer, the second layer comprising the first host and the first dopant.

13. A light emitting device comprising:
- a first electrode and a second electrode facing each other and spaced apart from each other;
- a plurality of stacks between the first electrode and the second electrode; and
- a charge generation layer between the plurality of stacks,
- wherein one of the plurality of stacks comprises a blue fluorescent light emitting layer and a non-blue phosphorescent light emitting layer in contact with each other, and at least one of remaining stacks comprises a single light emitting layer,
- the non-blue phosphorescent light emitting layer comprises:
  - a first host, and
  - a first dopant having a first triplet excitation level and a first singlet-triplet excitation level difference, and
- the blue fluorescent light emitting layer comprises:
  - a second dopant having:
    - a second singlet-triplet excitation level difference that is smaller than the first singlet-triplet excitation level difference, and
    - a second triplet excitation level that is higher than the first triplet excitation level; and
  - a second host having a third triplet excitation level between the first triplet excitation level and the second triplet excitation level.

14. The light emitting device according to claim 13, wherein the second host comprises at least one of a carbazole-based compound, a fluorene-based compound, a dibenzofuran-based compound, a triazine-based compound, and a quinazoline-based compound.

15. A light emitting device comprising:
- a first electrode and a second electrode facing each other and spaced apart from each other;
- a plurality of stacks between the first electrode and the second electrode; and
- a charge generation layer between the plurality of stacks,
- wherein the plurality of stacks includes a first stack comprising a blue fluorescent light emitting layer and a non-blue phosphorescent light emitting layer in contact with each other, and at least one of remaining stacks comprises a single light emitting layer,
- the non-blue phosphorescent light emitting layer comprises:
  - a first host, and
  - a first dopant having a first triplet excitation level and a first singlet-triplet excitation level difference, and
- the blue fluorescent light emitting layer comprises:
  - a second dopant having:
    - a second singlet-triplet excitation level difference that is smaller than the first singlet-triplet excitation level difference, and
    - a second triplet excitation level that is higher than the first triplet excitation level; and
  - a second host comprising a core compound and a spacer disposed at a distance of 1 nm or more from an outer surface of the core compound.

16. The light emitting device according to claim 15, wherein the spacer comprises a methyl group, a tertiary-butyl group, or a phenyl group, and
- the core compound has an end that is bonded to the spacer.

17. The light emitting device according to claim 15, wherein the non-blue phosphorescent light emitting layer has an emission peak at a wavelength of 600 nm to 650 nm, and
- the blue fluorescent light emitting layer has an emission peak at a wavelength of 430 nm to 480 nm.

18. The light emitting device according to claim 15, wherein the plurality of stacks includes four or more stacks, and
- the first stack contacts at least one of the first electrode and the second electrode.

19. The light emitting device according to claim 15, wherein the plurality of stacks includes four or more stacks, and
- at least one of the remaining stacks comprises:
  - at least one blue stack comprising a blue light emitting layer; and
  - a phosphorescent stack comprising a phosphorescent light emitting layer emitting light of a different color from the non-blue phosphorescent light emitting layer.

* * * * *